US007326597B2

(12) United States Patent
Forbes et al.

(10) Patent No.: US 7,326,597 B2
(45) Date of Patent: Feb. 5, 2008

(54) GETTERING USING VOIDS FORMED BY SURFACE TRANSFORMATION

(75) Inventors: Leonard Forbes, Corvallis, OR (US); Joseph E. Geusic, Berkeley Heights, NJ (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/167,894

(22) Filed: Jun. 27, 2005

(65) Prior Publication Data

US 2005/0250274 A1    Nov. 10, 2005

Related U.S. Application Data

(63) Continuation of application No. 10/623,794, filed on Jul. 21, 2003, now Pat. No. 6,929,984.

(51) Int. Cl.
*H01L 21/335*  (2006.01)
*H01L 21/8232*  (2006.01)

(52) U.S. Cl. .................. 438/143; 438/402; 438/471; 257/E21.318

(58) Field of Classification Search ............. 438/143, 438/402, 471, FOR. 144; 257/E21.318
See application file for complete search history.

(56) References Cited

U.S. PATENT DOCUMENTS

| | | | |
|---|---|---|---|
| 4,241,359 A | 12/1980 | Izumi et al. | |
| 4,314,595 A | 2/1982 | Yamamoto et al. | |
| 4,589,928 A | 5/1986 | Dalton | |
| 4,717,681 A | 1/1988 | Curran | |
| 4,962,051 A | 10/1990 | Liaw | |
| 5,426,061 A | 6/1995 | Sopori | |
| 5,443,661 A | 8/1995 | Oguro et al. | |

(Continued)

FOREIGN PATENT DOCUMENTS

EP    434984    9/1991

(Continued)

OTHER PUBLICATIONS

"Cornell Demonstrates a Universal Substrate", *Compound Semiconductor*, 3(2), (Mar./Apr. 1997), 27-29.

(Continued)

*Primary Examiner*—Michelle Estrada
(74) *Attorney, Agent, or Firm*—Schwegman, Lundberg & Woessner, P.A.

(57) ABSTRACT

One aspect of this disclosure relates to a method for creating a gettering site in a semiconductor wafer. In various embodiments, a predetermined arrangement of a plurality of holes is formed in the semiconductor wafer through a surface of the wafer. The wafer is annealed such that the wafer undergoes a surface transformation to transform the arrangement of the plurality of holes into a predetermined arrangement of at least one empty space of a predetermined size within the wafer to form the gettering site. One aspect relates to a semiconductor wafer. In various embodiments, the wafer includes at least one device region, and at least one gettering region located proximate to the at least one device region. The gettering region includes a precisely-determined arrangement of a plurality of precisely-formed voids that are formed within the wafer using a surface transformation process. Other aspects and embodiments are provided herein.

27 Claims, 13 Drawing Sheets

U.S. PATENT DOCUMENTS

| | | |
|---|---|---|
| 5,461,243 A | 10/1995 | Ek et al. |
| 5,471,180 A | 11/1995 | Brommer et al. |
| 5,482,869 A | 1/1996 | Kohyama |
| 5,526,449 A | 6/1996 | Meade et al. |
| 5,646,053 A | 7/1997 | Schepis et al. |
| 5,661,044 A | 8/1997 | Holland et al. |
| 5,691,230 A | 11/1997 | Forbes |
| 5,739,796 A | 4/1998 | Jasper et al. |
| 5,759,898 A | 6/1998 | Ek et al. |
| 5,773,152 A | 6/1998 | Okonogi |
| 5,789,859 A | 8/1998 | Watkins et al. |
| 5,840,590 A | 11/1998 | Myers, Jr. et al. |
| 5,879,996 A | 3/1999 | Forbes |
| 5,900,652 A | 5/1999 | Battaglia et al. |
| 5,963,817 A | 10/1999 | Chu et al. |
| 5,997,378 A | 12/1999 | Dynka et al. |
| 5,999,308 A | 12/1999 | Nelson et al. |
| 6,001,711 A | 12/1999 | Hashimoto |
| 6,022,793 A | 2/2000 | Wijaranakula et al. |
| 6,054,808 A | 4/2000 | Watkins et al. |
| 6,075,640 A | 6/2000 | Nelson |
| 6,083,324 A | 7/2000 | Henley et al. |
| 6,093,623 A | 7/2000 | Forbes |
| 6,093,624 A | 7/2000 | Letavic et al. |
| 6,127,777 A | 10/2000 | Watkins et al. |
| 6,136,666 A | 10/2000 | So |
| 6,139,626 A | 10/2000 | Norris et al. |
| 6,172,456 B1 | 1/2001 | Cathey et al. |
| 6,174,784 B1 | 1/2001 | Forbes |
| 6,204,145 B1 | 3/2001 | Noble |
| 6,228,694 B1 | 5/2001 | Doyle et al. |
| 6,251,751 B1 | 6/2001 | Chu et al. |
| 6,261,876 B1 | 7/2001 | Crowder et al. |
| 6,274,460 B1 | 8/2001 | Delgado et al. |
| 6,309,950 B1 | 10/2001 | Forbes |
| 6,315,826 B1 | 11/2001 | Muramatsu |
| 6,337,260 B1 | 1/2002 | Ishida |
| 6,338,805 B1 | 1/2002 | Anderson |
| 6,339,011 B1 | 1/2002 | Gonzalez et al. |
| 6,368,938 B1 | 4/2002 | Usenko |
| 6,376,336 B1 | 4/2002 | Buynoski |
| 6,377,070 B1 | 4/2002 | Forbes |
| 6,383,924 B1 | 5/2002 | Farrar et al. |
| 6,391,738 B2 | 5/2002 | Moore |
| 6,423,613 B1 | 7/2002 | Geusic |
| 6,424,001 B1 | 7/2002 | Forbes et al. |
| 6,436,187 B1 | 8/2002 | Patel et al. |
| 6,444,534 B1 | 9/2002 | Maszara |
| 6,448,157 B1 * | 9/2002 | Okonogi et al. ............ 438/471 |
| 6,448,601 B1 | 9/2002 | Forbes et al. |
| 6,451,672 B1 * | 9/2002 | Caruso et al. ............ 438/471 |
| 6,452,713 B1 | 9/2002 | White |
| 6,461,933 B2 | 10/2002 | Houston |
| 6,465,873 B1 | 10/2002 | Gonzalez |
| 6,478,883 B1 | 11/2002 | Tamatsuka et al. |
| 6,496,034 B2 | 12/2002 | Forbes et al. |
| 6,531,727 B2 | 3/2003 | Forbes et al. |
| 6,538,330 B1 | 3/2003 | Forbes |
| 6,541,356 B2 | 4/2003 | Fogel et al. |
| 6,542,682 B2 | 4/2003 | Cotteverte et al. |
| 6,559,491 B2 | 5/2003 | Forbes et al. |
| 6,566,682 B2 | 5/2003 | Forbes |
| 6,579,738 B2 | 6/2003 | Farrar et al. |
| 6,582,512 B2 | 6/2003 | Geusic et al. |
| 6,583,437 B2 | 6/2003 | Mizuno et al. |
| 6,593,625 B2 | 7/2003 | Christiansen et al. |
| 6,597,203 B2 | 7/2003 | Forbes |
| 6,630,713 B2 | 10/2003 | Geusic |
| 6,642,123 B2 * | 11/2003 | Mun et al. ............ 438/402 |
| 6,649,476 B2 | 11/2003 | Forbes |
| 6,656,822 B2 | 12/2003 | Doyle et al. |
| 6,740,913 B2 | 5/2004 | Doyle et al. |
| 6,898,362 B2 | 5/2005 | Forbes et al. |
| 6,929,984 B2 | 8/2005 | Forbes et al. |
| 2002/0001965 A1 | 1/2002 | Forbes |
| 2002/0048968 A1 | 4/2002 | Ahn |
| 2002/0062782 A1 | 5/2002 | Norris et al. |
| 2002/0070419 A1 | 6/2002 | Farrar et al. |
| 2002/0070421 A1 | 6/2002 | Ashburn |
| 2002/0076896 A1 | 6/2002 | Farrar et al. |
| 2002/0079557 A1 | 6/2002 | Ahn et al. |
| 2002/0175330 A1 | 11/2002 | Geusic et al. |
| 2002/0185686 A1 | 12/2002 | Christiansen et al. |
| 2003/0027406 A1 | 2/2003 | Malone |
| 2003/0042627 A1 | 3/2003 | Farrar et al. |
| 2003/0131782 A1 | 7/2003 | Geusic et al. |
| 2003/0133683 A1 | 7/2003 | Forbes |
| 2003/0157780 A1 | 8/2003 | Farrar et al. |
| 2003/0181018 A1 | 9/2003 | Geusic et al. |
| 2003/0190796 A1 | 10/2003 | Geusic |
| 2003/0201468 A1 | 10/2003 | Christiansen et al. |
| 2003/0218189 A1 | 11/2003 | Christiansen et al. |
| 2003/0227072 A1 | 12/2003 | Forbes |
| 2004/0176483 A1 | 9/2004 | Geusic |
| 2005/0017273 A1 | 1/2005 | Forbes et al. |
| 2005/0070036 A1 | 3/2005 | Geusic et al. |
| 2005/0105869 A1 | 5/2005 | Forbes et al. |
| 2006/0244105 A1 | 11/2006 | Forbes et al. |
| 2006/0258063 A1 | 11/2006 | Forbes |
| 2006/0258123 A1 | 11/2006 | Forbes |

FOREIGN PATENT DOCUMENTS

| | | |
|---|---|---|
| EP | 1030196 | 8/2000 |
| EP | 1085352 | 3/2001 |
| JP | 04304653 A * | 10/1992 |
| JP | 2001-093887 | 4/2001 |
| WO | WO-98/35248 | 8/1998 |
| WO | WO02097982 | 12/2002 |

OTHER PUBLICATIONS

Abe, T, "Silicon Wafer-Bonding Process Technology for SOI Structures", *Extended Abstracts of the 22nd (1990 International) Conference on Solid State Devices and Materials*, (1990), 853-856.

Auberton-Herve, A J., "SOI: Materials to Systems", *International Electron Devices Meeting. Technical Digest*, (1996), 3-10.

Autumn, Kellar, et al., "Adhesive force of a single gecko foot-hair", *Nature*, 405(6787), (Jun. 2000), 681-685.

Autumn, Kellar, et al., "Evidence for van der Waals adhesion in gecko satae.", *Proceedings of the National Academy of Science U S A.*; 99(19), (Sep. 17, 2002), 12252-6.

Baginski, T. A., "Back-side germanium ion implantation gettering of silicon", *Journal of the Electrochemical Society*, 135(7), Dept of Electrical Engineering, Auburn Univ, AL,(Jul. 1988), 1842-3.

Banhart, John, "Manufacture, characterisation and application of cellular metals and metal foams", *Progress in Materials Science*, vol. 46, Issue 6, (2001), 559-632.

Banhart, John, "On the road again: metal foams find favor", *Physics Today*, 55(7), (Jul. 2002), 37-42.

Belford, Rona E., et al., "Performance-Augmented CMOS Using Back-End Uniaxial Strain", *IEEE 60th DRC. Conference Digest Device Research Conference*, 2002, (Jun. 24-26, 2002), 41-42.

Berti, M., "Composition and Structure of Si-Ge Layers Produced by Ion Implantation and Laser Melting", *Journal of Materials Research*, 6(10), (Oct. 1991), 2120-2126.

Berti, M., "Laser Induced Epitaxial Regrowth of $Si_{1-x}GE_x$/Si Layers Produced by Ge Ion Implantation", *Applied Surface Science*, 43, (1989), 158-164.

Bialas, F., et al., "Intrinsic Gettering of 300 mm CZ Wafers", *Microelectronic Engineering*, 56(1-2), (May 2001), 157-63.

Biever, Celeste, "Secret of 'strained silicon' revealed: behind closed doors, Intel has perfected a novel way to improve chip performance.", *New Scientist*, 180(i2426-2428), (Dec. 20, 2003), 27.

Binns, M. J., et al., "The Realization of Uniform and Reliable Intrinsic Gettering in 200mm P- & P/P Wafers for a Low Thermal Budget 0.18 mu m Advanced CMOS Logic Process", *Diffusion and Defect Data Pt.B: Solid State Phenomena*, 82-84, (2001), 387-92.

Birner, A, "Macroporous silicon: a two-dimensional photonic bandgap material suitable for the near-infrared spectral range", *Physica Status Solidi A*; 165, (Jan. 16, 1998), 111-117.

Birner, A., "Silicon-Based Photonic Crystals", *Advanced Materials*, 13(6), (Mar. 2001), 377-388.

Blanco, A, "Large-scale synthesis of a silicon photonic crystal with a complete three-dimensional bandgap near 1.5 micrometres", *Nature*, 405(6785), (May 25, 2000), 437-40.

Blanford, C F., "Gems of Chemistry and Physics: Macroporous Metal Oxides with 3D Order", *Advanced Materials*, 13(6), (Mar. 2001).

Bronner, G. B., et al., "Physical Modeling of Backside Gettering", *Impurity Diffusion and Gettering in Silicon Symposium*, Sponsor: Mater. Res. Soc, Nov. 1984, Boston, MA, (1985), 27-30.

Brown, Chappell, "Bonding twist hints at universal substrate", *EETimes*, (1997), 2 pages.

Bruel, M, "Smart-Cut: a new silicon on insulator material technology based on hydrogen implantation and wafer bonding", *Japanese Journal of Applied Physics, Part 1 (Regular Papers, Short Notes & Review Papers)*, 36(3B), (1997), 1636-1641.

Chen, Xiangdong, et al., "Vertical P-MOSFETs with heterojunction between source/drain and channel", *IEEE Device Research Conference*, (2000), 25-26.

Chilton, B T., et al., "Solid phase epitaxial regrowth of strained Si(1-x)GE(x)/Si strained layer structures amorphized by ion implantation", *Applied Physics Letters*, 54(1), (Jan. 2, 1989), 42-44.

Choe, K. S., et al., "Minority-Carrier Lifetime Optimization in Silicon MOS Devices by Intrinsic Gettering", *Journal of Crystal Growth*, 218(2-4), (Sep. 2000), 239-44.

Clark, Don, et al., "Intel unveils tiny new transistors: Process handles circuits 1/2000th the width of a human hair", *The Wall Street Journal*, (Aug. 13, 2002), 3 pages.

Clifton, P A., et al., "A process for strained silicon n-channel HMOSFETs", *ESSDERC'96. Proceedings of the 26th European Solid State Device Research Conference*, (Sep. 1996), 519-22.

Dubbelday, W B., et al., "Oscillatory strain relaxation in solid phase epitaxially regrown silicon on sapphire", *Proceedings of the First International Workshop Lattice Mismatched Thin Films*, (Sep. 13-15, 1998), 13-17.

Edrington, A C., "Polymer-Based Photonic Crystals", *Advanced Materials*, 13(6), (Mar. 2001), 421-425.

Fischetti, M V., et al., "Band structure, deformation potentials, and carrier mobility in strained Si, Ge, and SiGe alloys", *Journal of Applied Physics*, 80(4), (Aug. 15, 1996), 2234-2252.

Fournel, F, et al., "Ultra High Precision Of The Tilt/Twist Misorientation Angles In Silicon/Silicon Direct Wafer Bonding", *Abstract—Electronic Materials Conference*, (Jun. 2002), 9.

Garcia, G A., et al., "High-quality CMOS in thin (100 nm) silicon on sapphire", *IEEE Electron Device Letters*, 9(1), (Jan. 1988), 32-34.

Godbole, H., et al., "An Investigation of Bulk Stacking Faults in Silicon Using Photocapacitance Transient Spectroscophy", *Materials Letters*, 8(6-7), Dept of Electr & Comput Engr, Oregon State Univ, Corvallis OR,(Jul. 1989), 201-3.

Gong, S. S., et al., "Implantation Gettering in Silicon", *Solid-State Electronics*, 30(2), (Feb. 1987), 209-11.

Graf, D., et al., "300 mm epi pp- wafer: is there sufficient gettering?", *High Purity Silicon VI. Proceedings of the Sixth International Symposium (Electrochemical Society Proceedings* vol. 2000-17) (SPIE vol. 4218), (2000), 319-30.

Haddad, H., et al., "Carbon Doping Effects on Hot Electron Trapping", *28th Annual Proceedings. Reliability Physics 1990*, (Mar. 1990), 288-9.

Haddad, H., et al., "Electrical Activity of Bulk Stacking Faults in Silicon", *Materials Letters*, 7(3), Hewlett-Packard Northwest Integrated Circuits Div, Corvallis OR,(Sep. 1988),99-101.

Harendt, Christine, "Silicon on Insulator Material by Wafer Bonding", *Journal of Electronic Materials*, 20(3), (Mar. 1991), 267-77.

Ho, K, "Existence of a photonic gap in periodic dielectric structures", *Physical Review Letters*, 65(25), (Dec. 17, 1990), 3152-3155.

Holland, Brian T., "Synthesis of Macroporous Mineral with Highly Ordered Three-Dimensional Arrays of Spheroidal Voids", *Science*, 281, (Jul. 24, 1998), 538-540.

Iyer, S S., "Separation by Plasma Implantation of Oxygen (SPIMOX) operational phase space", *IEEE trans. on Plasma Science*, 25, (1997), 1128-1135.

Jiang, P, "The Fabrication and Bandgap Engineering of Photonic Multilayers", *Advanced Materials*, 13(6), (Mar. 2001), 389-393.

Joannopoulos, J D., "Photonic crystals : molding the flow of light", Princeton, N.J. : *Princeton University Press*, (1995), 6.

John, S, "Photonic bandgap formation and tunability in certain self-organizing systems", *Journal of Lightwave Technology*, 17(11), (Nov. 1999), 1931-1943.

Johnson, S G., "Guided modes in photonic crystal slabs", *Physical Review B (Condensed Matter)*, 60(8), (Aug. 15, 1999), 5751-8.

Jurczak, M, "SON (silicon on nothing)-a new device architecture for the ULSI era", *VLSI Technology, 1999. Digest of Technical Papers. 1999 Symposium on*, Jun. 14-16, 1999, (Jun. 1999), 29-30.

Kalavade, Pranav, et al., "A novel sub-10 nm transistor", *58th DRC. Device Research Conference. Conference Digest*, (Jun. 19-21, 2000), 71-72.

Kang, J. S., et al., "Getting in Silicon", *Journal of Applied Physics*, 65(8), Center for Solid State Electron Res., Arizona State Univ. Tempe, AZ, (Apr. 15, 1989), 2974-85.

Kostrzewa, M, et al., "Testing the Feasibility of strain relaxed InAsP and InGaAs complaint substrates", *EMC 2003 International Conference Indium Phosphide and Related Materials. Conference Proceedings*, (Jun. 2003), 8.

Kung, C. Y., et al., "The effect of carbon on oxygen precipitation in high carbon CZ silicon crystals", *Materials Research Bulletin*, 18(12), Silicon Materials Div., Fairchild Camera & Instrument Corp, Healdsburg, CA,(Dec. 1983), 1437-41.

Lasky, J. B., "Wafer Bonding for Silicon-on-Insulator Technologies", *Applied Physics Letters*, 48(1), (Jan. 6, 1986),78-80.

Li, Y. X., et al., "New intrinsic gettering process in Czochralski-silicon wafer", *6th International Conference on Solid-State and Integrated Circuit Technology. Proceedings*,1(1), (2001), 277-9.

Li, Z Y., "Photonic Bandgaps in Disordered Inverse-Opal Photonic Crystals", *Advanced Materials*, 13(6), (Mar. 2001), 433-436.

Lin, Shawn Yu, "A three-dimensional optical photonic crystal", *Journal of Lightwave Technology*, 17(11), (Nov. 1999), 1944-1947.

Loncar, M, "Waveguiding in planar photonic crystals", *Applied Physics Letters*, 77(13), (Sep. 25, 2000), 1937-1939.

Loo, Y L., et al., "Contact Printing With Nanometer Resolution", *Device Research Conference*, (Jun. 2002), 149-150.

Lu, D,, "Bonding Silicon Wafers by Use of Electrostatic Fields Followed by Rapid Thermal Heating", *Materials Letters*, 4(11), (Oct. 1986), 461-464.

Lu, Y, "Three-Dimensional Photonic Crystals with Non-spherical Colloids as Building Blocks", *Advanced Materials*, 13(6), (Mar. 2001), 415-420.

Manoharan, V N., "Photonic Crystals from Emulsion Template", *Advanced Materials*, 13(6), (Mar. 2001), 447-450.

Miguez, H, "Synthesis and Photonic Bandgap Characterization of Polymer Inverse Opals", *Advanced Materials*, 13(6), (Mar. 2001), 393-396.

Mitsutake, K, "Theoretical Study on the Formation Process of Empty Space in Silicon (ESS)", *2000 International Conference on Solid State Devices and Materials*, (2000), 198-199.

Mizuno, T, et al., "Advanced SOI-MOSFETs with Strained-Si Channel for High Speed CMOS Electron/Hole Mobility Enhancement", *2000 Symposium on VLSI Technology. Digest of Technical Papers*, (2000), 210-211.

Mizushima, I., "Empty-space-in-silicon technique for fabricating a silicon-on-nothing structure", *Applied Physics Letters*, 77(20), American Institute of Physics, NY,(Nov. 13, 2000), 3290-3292.

Moran, Peter, "Strain Relaxation in Wafer-Bonded SiGe/Si Heterostructures Due to Viscous Flow of an Underlying Borosilicate Glass", *Electronic Materials Conference, Santa Barbara*, Jun. 2002, Abstract,(Jun. 2002), pp. 8-9.

Mumola, P. B., et al., "Recent advances in thinning of bonded SOI wafers by plasma assisted chemical etching", *Proceedings of the Third International Symposium on Semiconductor Wafer Bonding: Physics and Applications*, (1995), 28-32.

Nayak, D.K., "High performance GeSi quantum-well PMOS on SIMOX", *International Electron Devices Meeting 1992. Technical Digest*, (1992), 777-80.

Ni, P, "Synthetic $SiO_2$ Opals", *Advanced Materials*, 13(6), (Mar. 2001), 437-441.

Nichols, F A., et al., "Surface- (interface-) and volume-diffusion contributions to morphological changes driven by capillarity", *Transactions of the American Institute of Mining, Metallurgical and Petroleum Engineers*, 233(10), (1965), 1840-8.

Norris, D J., "Chemical Approaches to Three-Dimensional Semiconductor Photonic Crystals", *Advanced Materials*, 13(6), (Mar. 2001), 371-376.

O'Neill, A G., et al., "High speed deep sub-micron MOSFET using high mobility strained silicon channel", *ESSDERC '95. Proceedings of the 25th European Solid State Device Research Conference*, (Sep. 1995), 109-12.

Omi, Hiroo, et al., "Semiconductor Surface with Strain Control", http://www.brl.ntt.co.jp/J/kouhou/katsudou/report00/E/report04_e.html.

Or, B S., et al., "Annealing effects of carbon in n-channel LDD MOSFETs", *IEEE Electron Device Letters*, 12(11), Dept of Electrical & Computing Engr, Oregon State Univ, Corvallis OR,(Nov. 1991), 596-8.

Ouyang, Q, et al., "Bandgap Engineering in Deep Submicron Vertical pMOSFETs", *IEEE 58th DRC. Device Research Conference. Conference Digest*, (2000), 27-28.

Paine, D. C., "The Growth of Strained Si]-xGex Alloys on (100) Silicon Using Solid Phase Epitaxy", *Journal of Materials Research*, 5(5), (May 1990), 1023-1031.

People, R., "Calculation of critical layer thickness versus lattice mismatch for GexSi1-x/Si strained-layer heterostructures", *Applied Physics Letters*, 47(3), (Aug. 1, 1985), 322-4.

Rim, Kern, et al., "Fabrication and analysis of deep submicron strained-Si n-MOSFET's", *IEEE Transactions on Electron Devices*, 47(7), (Jul. 2000), 1406-1415.

Rim, Kern, et al., "Strained Si NMOSFETs for High Performance CMOS Technology", *2001 Symposium on VLSI Technology. Digest of Technical Papers*, (2001), 59-60.

Rim, Kern, et al., "Transconductance enhancement in deep submicron strained Si n-MOSFETs", *International Electron Devices Meeting 1998 Technical Digest*, (1998), 707-710.

Rubin, L, et al., "Effective gettering of oxygen by high dose, high energy boron buried layers", *1998 International Conference on Ion Implantation Technology. Proceedings*, 2(2), (1998), 1010-13.

Sato, Tsutomu, "A New Substrate Engineering for the Formation of Empty Space in Silicon (ESS) Induced by Silicon Surface Migration", *IEDM Digest, paper 20.6.1*, (1999), 20.6.1-20.6.4.

Sato, T, "Trench transformation technology using hydrogen annealing for realizing highly reliable device structure with thin dielectric films", *1998 Symposium on VLSI Technology Digest of Technical Papers*, (1998), 206-7.

Smith, C J., "Low-loss channel waveguides with two-dimensional photonic crystal boundaries", *Applied Physics Letters*, 77(18), (Oct. 30, 2000), 2813-2815.

Subramania, G, *Advanced Materials*, 13(6), Inverse Face-Centered Cubic Thin Film Photonic Crystals,(Mar. 2001), 443-446.

Sugiyama, N, et al., "Formation of strained-silicon layer on thin relaxed SiGe/SiO/sub 2//Si structure using SIMOX technology", *Thin Solid Films*, 369(1-2), (Jul. 2000), 199-202.

Takagi, Shin-Ichi, "Strained-Si- and SiGe-On-Insulator (Strained-SOI and SGOI) MOSFETs for High Performance/Low Power CMOS Application", *IEEE Device Research Conference, 2002. 60th DRC. Conference Digest*, (2002), 37-40.

Tan, T. Y., et al., "Intrinsic gettering by oxide precipitate induced dislocations in Czochralski Si", *Applied Physics Letters*, 30(4), (Feb. 15, 1977), 175-6.

Tessier, P M., "Structured Metallic Films for Optical and Spectroscopic Applications via Colloidal Crystal Templating", *Advanced Materials*, 13(6), (Mar. 2001), 396-400.

Verdonckt-Vandebroek,, Sophie, et al., "SiGe-Channel Heterojunction p-MOSFET's", *IEEE Transactions on Electron Devices*, 41(1), (Jan. 1994), 90-101.

Welser, J, et al., "Strain dependence of the performance enhancement in strained-Si n-MOSFETs", *IEEE International Electron Devices Meeting 1994. Technical Digest*, (Dec. 11-14, 1994), 373-376.

Whitwer, F. D., et al., "DLTS characterization of precipitation induced microdefects", *Materials Issues in Silicon Integrated Circuit Processing Symposium*, (Apr. 1986), 53-57.

Wijaranakula, W., et al., "Effect of Pre- and Postepitaxial Deposition Annealing on Oxygen Precipitation in Silicon", *Journal of Materials Research*, 1(5), Dept of Electr & Comput Eng, Oregon State Univ, Corvallis, OR,(Sep.-Oct. 1986), 698-704.

Wijaranakula, W., et al., "Effect of preanneal heat treatment on oxygen precipitation in epitaxial silicon", *Materials Issues in Silicon Integrated Circuit Processing Symposium*, (Apr. 1986), 139-44.

Wijaranakula, W., et al., "Internal Gettering Heat Treatments and Oxygen Precipitation in Epitaxial Silicon Wafers", *Journal of Materials Research*, 1(5), Dept of Electr & Comput. Eng, Oregon State Univ., Corvallis, OR, (Sep.-Oct. 1986), 693-7.

Wijaranakula, W., et al., "Oxygen precipitation in p/p+(100) epitaxial silicon material", *Journal of the Electrochemical Society*, 134(9), SEH America, Inc., Mater. Characterization Lab., Vancouver, WA,(Sep. 1987), 2310-16.

Wild, M., "Laser Assisted Bonding of Silicon and Glass in Micro-System Technology", http://www.ilt.fhg.de/eng/jb00-s42.html, Fraunhofer ILT—jp00-s42, (2003), 1.

Xia, Y, "Photonic Crystals", *Advanced Materials*, 13(6), (Mar. 2001), 369.

Xia, Y, "Self-Assembly Approaches to Three-Dimensional Photonic Crystals", *Advanced Materials*, 13(6), (Mar. 2001), 409-413.

Xuan, Peiqi, et al., "60nm Planarized Ultra-thin Body Solid Phase Epitaxy MOSFETs", *IEEE Device Research Conference, Conference Digest. 58th DRC*, (Jun. 19-21, 2000), 67-68.

Yablonovitch, E, "Inhibited spontaneous emission in solid-state physics and electronis", *Physical Review Letters*, 58(20), (May 18, 1987), 2059-62.

Yablonovitch, E, "Photonic band structure: the face-centered-cubic case employing nonspherical atoms", *Physical Review Letters*, 67(17), (Oct. 21, 1991), 2295-8.

Yang, D., et al., "Intrinsic Gettering in Nitrogen Doped Czochralski Crystal Silicon", *High Purity Silicon VI. Proceedings of the Sixth International Symposium (Electrochemical Society Proceedings vol. 2000-17) (SPIE vol. 4218*, (2000), 357-61.

Yang, Deren, et al., "Nitrogen in Czochralski Silicon", *2001 6th International Conference on Solid-State and Integrated Circuit Technology. Proceedings*, 1(1), (2001), 255-60.

Yang, P, "Patterning Porous Oxides within Microchannel Networks", *Advanced Materials*, 13(6), (Mar. 2001), 427-431.

Yin, Haizhou, "High Ge-Content Relaxed Si1-xGex Layers by Relaxation on Complaint Substrate with Controlled Oxidation", *Electronic Materials Conference*, Santa Barbara, Jun. 2002, 8.

Zhu, Z H., et al., "Wafer bonding and its application on complaint universal (CU) substrates", *Conference Proceedings, 10th Annual Meeting IEEE Lasers and Electro-Optics Society*, (Nov. 10-13, 1996), 31.

Zhu, Z H., et al., "Wafer bonding technology and its applications in optoelectronic devices and materials", *IEEE Journal of Selected Topics in Quantum Electronics*, (Jun. 1997), 927-936.

\* cited by examiner

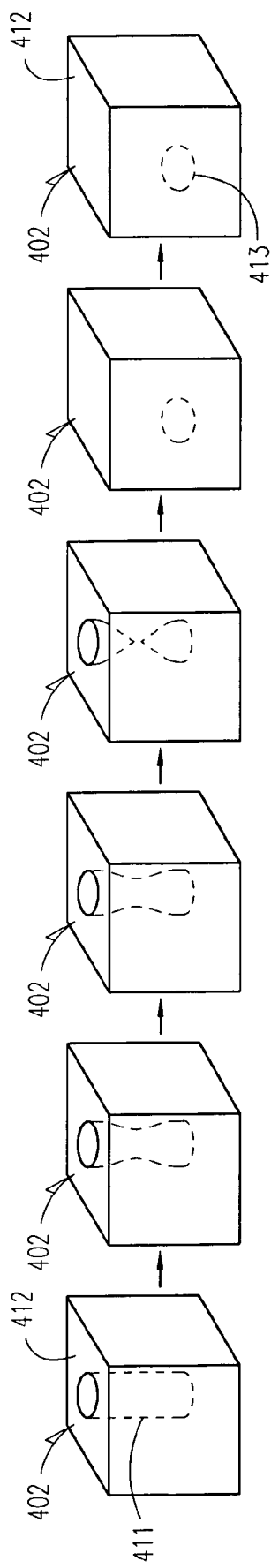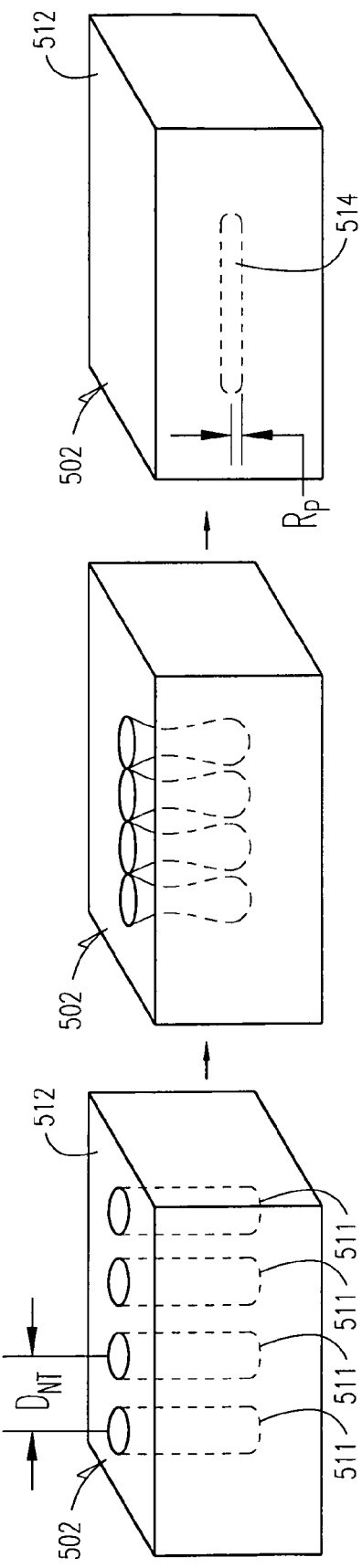

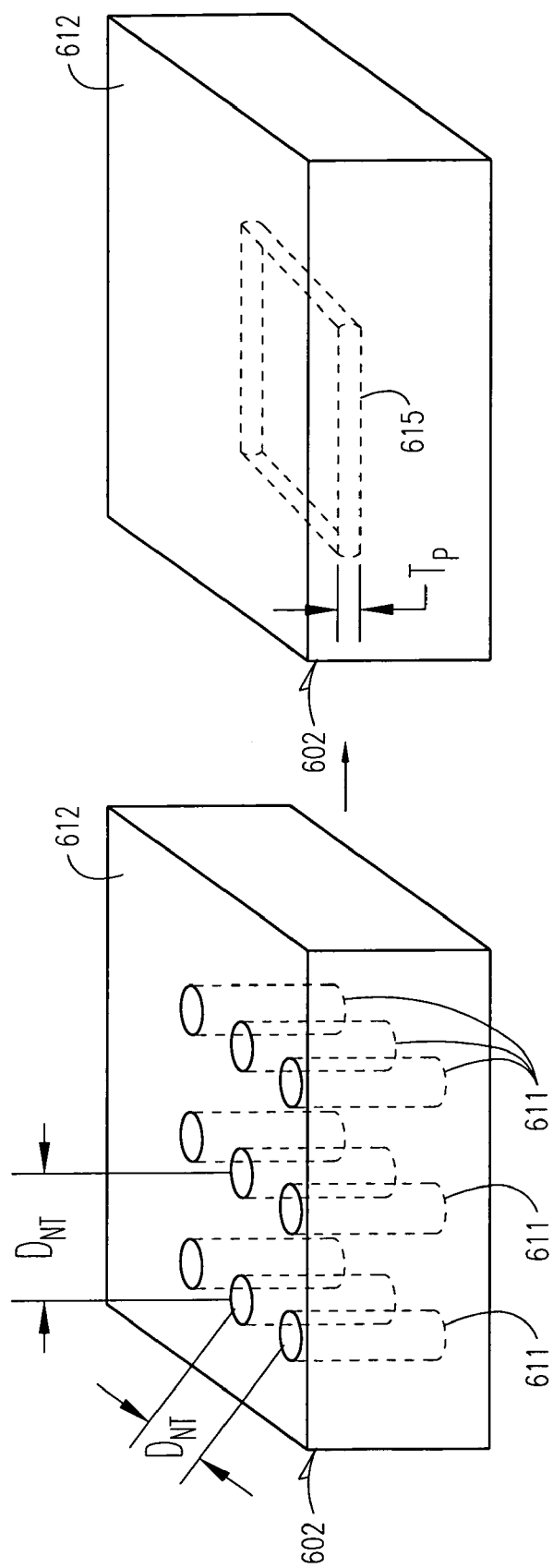

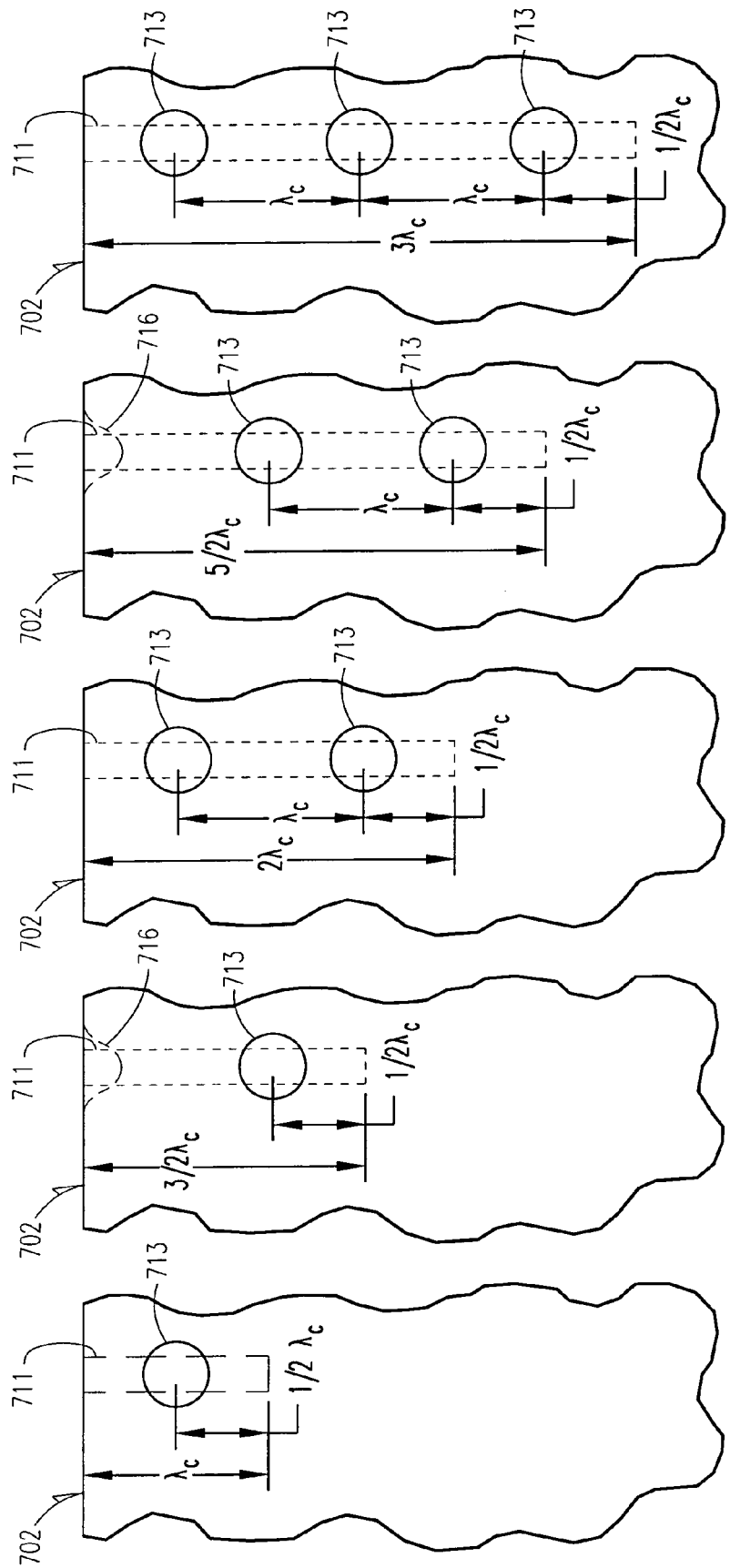

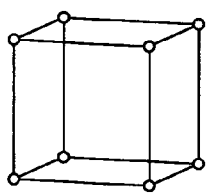 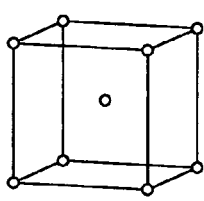 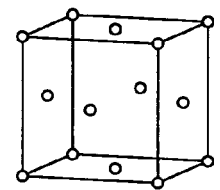
CUBIC P    CUBIC I    CUBIC F
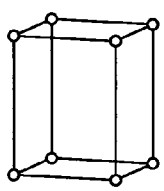 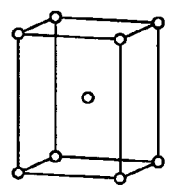
TETRAGONAL P    TETRAGONAL I
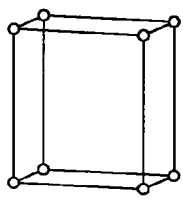 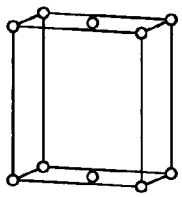 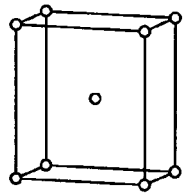 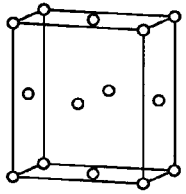
ORTHORHOMBIC P    ORTHORHOMBIC C    ORTHORHOMBIC I    ORTHORHOMBIC F
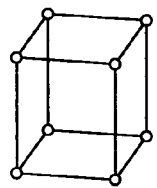 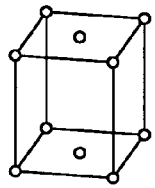 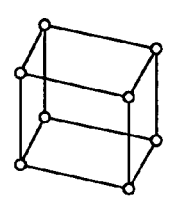
MONOCLINIC P    MONOCLINIC C    TRICLINIC
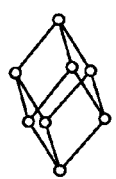 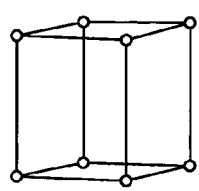
TRIGONAL R    TRIGONAL AND HEXAGONAL P
FIG. 9

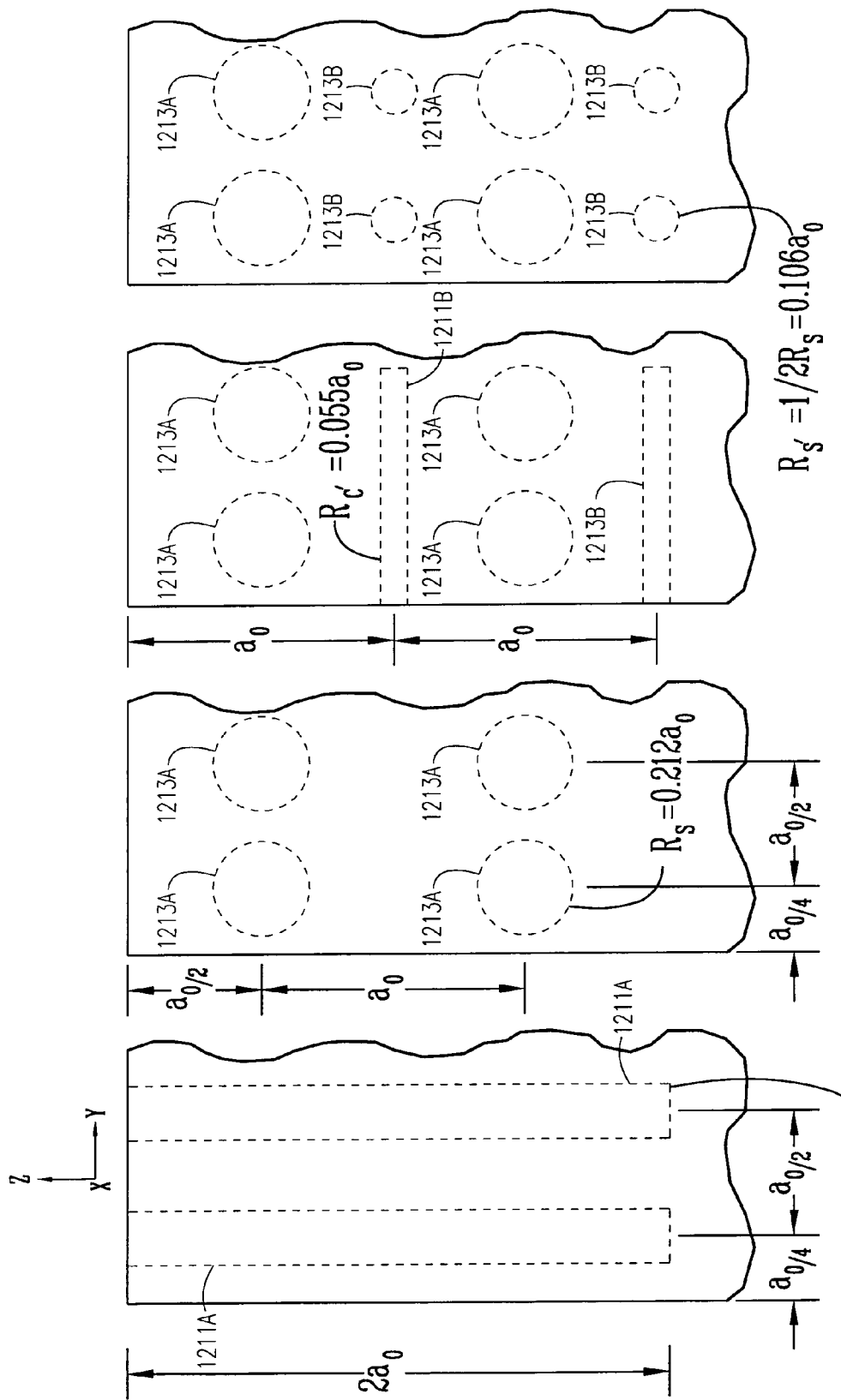

GETTERING USING VOIDS FORMED BY SURFACE TRANSFORMATION

CROSS REFERENCE TO RELATED APPLICATIONS

The present application is a continuation of U.S. application Ser. No. 10/623,794, filed Jul. 21, 2003, now U.S. Pat. No. 6,929,984 which is incorporated herein by reference.

This application is related to the following commonly assigned U.S. patent applications which are herein incorporated by reference in their entirety: "Cellular Materials Formed Using Surface Transformation," application Ser. No. 10/382,246, filed Mar. 5, 2003; "Gettering of Silicon On Insulator Using Relaxed Silicon Germanium Epitaxial Proximity Layers," application Ser. No. 10/443,337, filed May 21, 2003; and "Wafer Gettering Using Relaxed Silicon Germanium Epitaxial Proximity Layers," application Ser. No. 10/443,339, filed May 21, 2003.

TECHNICAL FIELD

This disclosure relates generally to integrated circuits, and more particularly, to strained semiconductor structures.

BACKGROUND

Unwanted crystalline defects and impurities can be introduced during crystal growth or subsequent wafer fabrication processes. These defect and impurities can degrade device characteristics and overall yield. Gettering has been described as a process for moving contaminants and/or defects in a semiconductor into its bulk and away from its top surface to create a denuded zone cleared from contaminants and/or defects. Preferably, devices are built in the denuded zone.

Historically, extrinsic backside gettering was used to getter silicon wafers. Various extrinsic backside gettering processes involve damaging the backside of the wafer mechanically or by implanting argon, germanium, hydrogen or other implants, or providing a gettering layer on the backside of the wafer using a phophorosilicate glass or oxide backside layer, a polysilicon backside layer, and a silicon germanium (SiGe) backside epitaxial layer. Subsequently, "intrinsic" gettering was developed, which employed oxygen precipitation and "bulk microdefects" precipitated into the bulk of the wafer after the surface was "denuded" of oxygen. The precipitation process, the gettering effects, and the electrical characterization of defects and gettering silicon wafers have been investigated. Recently, intrinsic gettering modifications have been developed, including neutron irradiation, high boron doping, nitrogen doping, and the use of magnetic fields during crystal growth.

These gettering processes depend on the diffusion of unwanted impurities over significant distances from desired device regions to the gettering sites. However, modern low temperature processes have small thermal budgets, and do not afford an opportunity for significant diffusion of dopants and/or unwanted impurities. Thus, it is desirable to reduce the distance between the gettering sites and the device area. It has been previously proposed to implant various impurities in proximity to the device areas, to co-implant oxygen and silicon to form a gettering layer in close proximity to the device area, to implant helium to form cavities close to the device areas which getter impurities, and to getter material in trench isolation areas in close proximity to the device areas.

Implanting helium forms cavities that function to getter impurities. This helium implantation technique has been proposed to getter both bulk and silicon-on-insulator devices. However, the location and density of these cavities formed by implanting helium is random. One problem associated with the random location and density of cavities is that the effectiveness of the gettering unwanted impurities from the desired device regions is inconsistent. Other problems associated with the random location and density of cavities involves the varying strain in the substrate and the varying ability of the substrate to withstand mechanical strain. The inconsistent effectiveness of gettering, the inconsistent strain and the inconsistent ability to withstand strain can negatively affect the ability to precisely form devices as the semiconductor industry strives to fabricate smaller and thinner devices.

SUMMARY

The above mentioned problems are addressed and will be understood by reading and studying this specification. Various aspects and embodiments of the present invention getter a semiconductor wafer by precisely forming voids, such as nano-sized voids, at desired locations in the wafers. Thus, precisely-formed gettering void patterns are formed in selected regions below where devices are fabricated on semiconductor wafers. Numerous dangling bonds are present at the internal surfaces of the voids such that these internal surfaces are highly chemically reactive. Thus, various embodiments form the voids and void patterns to have a large surface to volume ratio to increase gettering of impurities.

One aspect of this disclosure relates to a method for creating a gettering site in a semiconductor wafer. In various embodiments, a predetermined arrangement of a plurality of holes is formed in the semiconductor wafer through a surface of the wafer. The wafer is annealed such that the wafer undergoes a surface transformation to transform the arrangement of the plurality of holes into a predetermined arrangement of at least one empty space of a predetermined size within the wafer to form the gettering site.

One aspect relates to a semiconductor wafer. In various embodiments, the wafer includes at least one device region, and at least one gettering region located proximate to the at least one device region. The gettering region includes a precisely-determined arrangement of a plurality of precisely-formed voids that are formed within the wafer using a surface transformation process. Other aspects and embodiments are provided herein.

This Summary is an overview of some of the teachings of the present application and not intended to be an exclusive or exhaustive treatment of the present subject matter. Further details are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their legal equivalents.

BRIEF DESCRIPTION OF THE DRAWINGS

FIGS. 4A-4F illustrate a process to form a sphere-shaped empty space in a gettering region, according to various embodiments of the present invention.

FIGS. 5A-5C illustrate a process to form a pipe-shaped empty space in a gettering region, according to various embodiments of the present invention.

FIGS. 6A-6B illustrate a process to form a plate-shaped empty space in a gettering region, according to various embodiments of the present invention.

FIGS. 7A-7E illustrate the formation of empty spheres in a gettering region from initial cylindrical holes with the same radii and with varying length, according to various embodiments of the present invention.

FIG. 9 illustrates fourteen representative unit cells of space lattices which the voids in the gettering region can form, according to various embodiments of the present invention.

FIGS. 12A-12D illustrate a process for forming a simple unit of empty spheres having two radii in a gettering region, according to various embodiments of the present invention.

DETAILED DESCRIPTION

The following detailed description refers to the accompanying drawings which show, by way of illustration, specific aspects and embodiments in which the present invention may be practiced. The various embodiments are not necessarily mutually exclusive as aspects of one embodiment can be combined with aspects of another embodiment. Other embodiments may be utilized and structural, logical, and electrical changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art. The terms "horizontal" and "vertical", as well as prepositions such as "on", "over" and "under" are used in relation to the conventional plane or surface of a wafer or substrate, regardless of the orientation of the wafer or substrate. References to "an", "one", or "various" embodiments in this disclosure are not necessarily to the same embodiment, and such references contemplate more than one embodiment. The following detailed description is, therefore, not to be taken in a limiting sense, and the scope of the present invention is defined only by the appended claims, along with the full scope of equivalents to which such claims are entitled.

Aspects of the present invention precisely form voids at desired location using a surface transformation process to getter semiconductor wafers. Various embodiments precisely form patterns of nano-voids (voids having a diameter on the order of a nanometer) as a proximity gettering region to effectively and consistently getter impurities from device regions.

Figure 1:
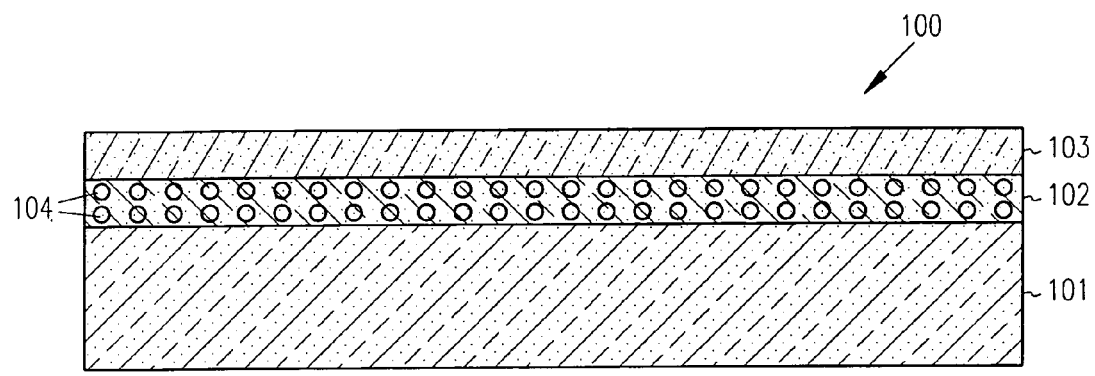
FIG. 1 illustrates a semiconductor structure having a gettering region with precisely formed voids at precise locations, according to various embodiments of the present invention.

FIG. 1 illustrates a semiconductor structure having a gettering region with precisely formed voids at precise locations, according to various embodiments of the present invention. The illustrated structure 100 includes a semiconductor wafer, also referred to here as a substrate 101. A proximity gettering region 102 is located near to a device region 103 such that unwanted impurities can travel a short distance from the device region 103 to the gettering region 102, even with modern low temperature processes. The gettering region 102 includes a number of precisely formed and located voids 104 formed by surface transformation. Surface transformation is described in detail below. The present invention is not limited to gettering regions having a particular pattern, shape or size of voids. In various embodiments, the device region 103 includes crystalline silicon. Semiconductor devices, such as transistors, are fabricated in the crystalline silicon. Other crystalline semiconductor materials can be used to form the device region 103. Thus, it is desired to getter unwanted impurities from the device region. The voids 104 in the gettering region 102 generate defects that getter impurities from the device region 103. The internal surfaces of the voids have numerous dangling bonds, and thus are highly chemically reactive, which serves to getter impurities from the device region 103.

Figure 2:
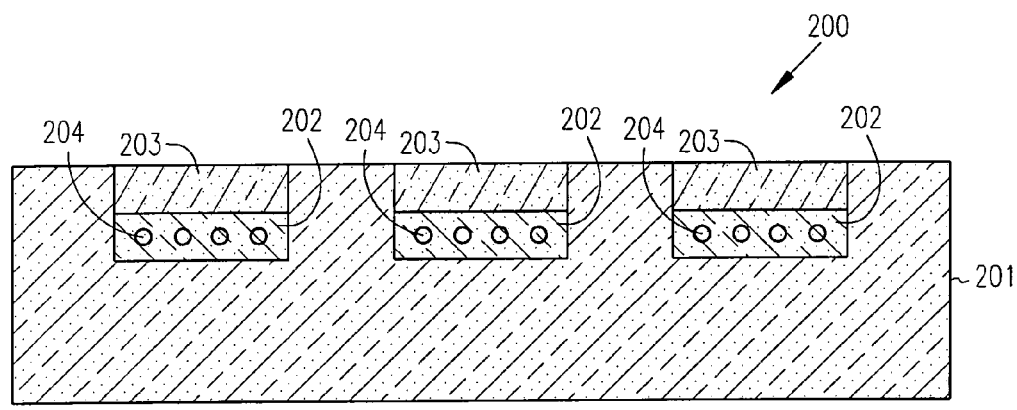
FIG. 2 illustrates a semiconductor structure having a gettering region with precisely formed voids at precise locations, according to various embodiments of the present invention.

FIG. 2 illustrates a semiconductor structure having a gettering region with precisely formed voids at precise locations, according to various embodiments of the present invention. The illustrated structure 200 includes a semiconductor wafer, also referred to here as a substrate 201. A number of proximity gettering regions 202 are located near to a number of device regions 203 such that unwanted impurities can travel a short distance from the device regions 203 to the gettering regions 202, even with modern low temperature processes. The gettering region 202 includes a number of precisely formed and located voids 204. The present invention is not limited to gettering regions having the illustrated pattern, size or shape of voids. The voids create defects that are highly chemically reactive and serve to getter impurities from the device region 203.

Figure 3:
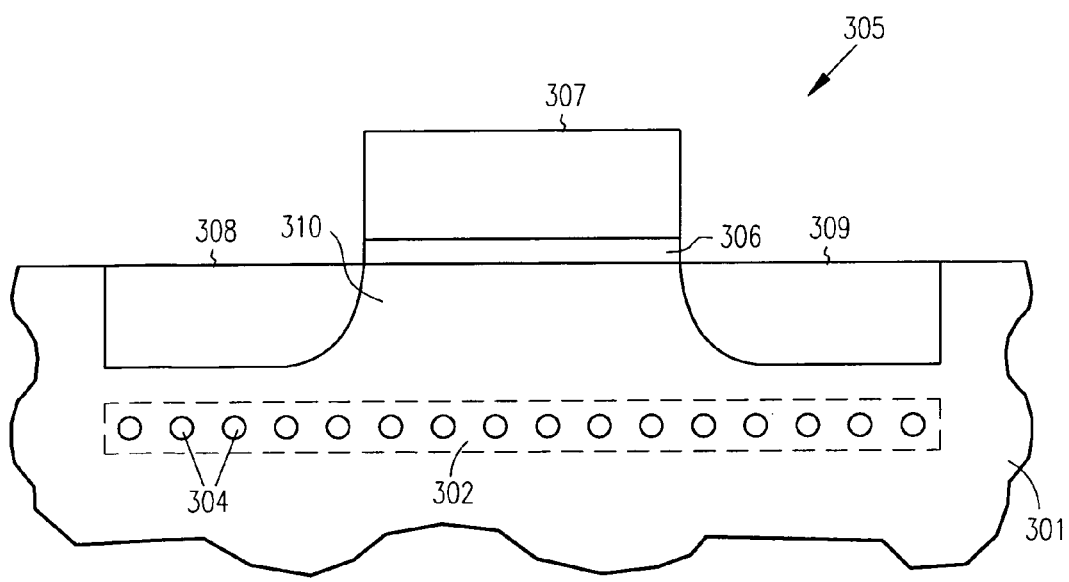
FIG. 3 illustrates a transistor formed in a device region proximate to a gettering region with precisely formed voids at precise locations, according to various embodiments of the present invention.

FIG. 3 illustrates a transistor formed in a device region proximate to a gettering region with precisely formed voids at precise locations, according to various embodiments of the present invention. The illustrated transistor 305 is fabricated over a proximity gettering region 302. The gettering region 302 has a predetermined and precise arrangement of precisely formed voids 304. A gate oxide 306 is formed on the substrate 301, and a gate is formed over the gate oxide. First and second diffusion regions 308 and 309 are formed. A transistor channel region 310 is formed between the first and second diffusion regions 308 and 309. Other devices, such as capacitors and diodes, can be formed in device regions proximate to a gettering region. These gettering regions and device regions can be formed in both bulk and semiconductor-on-insulator (SOI) technology. Furthermore, these gettering regions can be used to getter both strained and unstrained device regions.

In various embodiments, the precisely-determined arrangement of voids provides the gettering region with voids that are more uniformly spaced and with a majority of voids that are closed voids. The uniformity, density, and space symmetry of the voids in the gettering region is precisely determined by controlling the diameter, depth and position of an initial arrangement of cylindrical holes formed through a surface of a solid (e.g. a surface of a semiconductor wafer). In various embodiments, the holes have a generally-elongated shape extending into the volume away from the surface. In various embodiments, the holes have a generally cylindrical shape. The present subject matter is not so limited, however.

The voids in the gettering region generate defects that getter impurities from the device region. The internal surfaces of the voids have numerous dangling bonds, and thus are highly chemically reactive which serves to getter impurities from the device region. Thus, various embodiments for voids and voids patterns to have a large surface to volume ratio to increase the gettering of impurities. In various embodiments, the precisely-determined arrangement of voids provides the semiconductor wafer with a predictable mechanical failure for a given force. In various embodiments, the precisely-determined arrangement of voids provides the semiconductor wafer with an anisotropic stiffness.

When a solid is heated to a higher temperature, a solid with a hole that is beyond a critical length ($\lambda_c$) becomes unstable. For the purposes of the analysis provided below, the holes are referred to as cylindrical holes. Upon reading and comprehending this disclosure, one of ordinary skill in the art will understand that holes which are not geometrically cylindrical can be used in a surface transformation process, and further will understand how to form a predetermined arrangement of voids using holes that are not geometrically cylindrical.

The cylindrical hole is transformed into one or more empty spheres formed along the cylinder axis. The number (N) of spheres formed depends on the length (L) and radius ($R_C$) of the cylinder. Two models of diffusion are the surface diffusion model and the pure volume diffusion model. With respect to the surface diffusion model, for example, the relation between the cylinder length (L), cylinder radius ($R_C$), and number of spheres (N) is expressed by the following equation:

$$8.89 \times R_C \times N \leq L < 8.89 \times R_C \times (N+1). \tag{1}$$

Equation (1) predicts that no empty spheres will form if $L < 8.89 \times R_C$. Each empty sphere that forms has a radius ($R_S$) expressed by the following equation:

$$R_S = 1.88 \times R_C. \tag{2}$$

If the cylinder has sufficient length L to form two spheres, the center-to-center spacing between the spheres corresponds to the critical length ($\lambda_C$) and is provided by the equation:

$$\lambda_C = 8.89 \times R_C. \tag{3}$$

The pure volume diffusion model provides similar results, with slightly different constants. For example, depending on the exact magnitude of the diffusion parameters, $\lambda_C$ can vary from $9.02 \times R_C$ to $12.96 \times R_C$. One of ordinary skill in the art will understand, upon reading and understanding this disclosure, that the diffusion model is capable of being determined by experiment. The remainder of this disclosure uses the surface diffusion model. One of ordinary skill in the art will understand, upon reading and comprehending this disclosure, how to apply this disclosure to another diffusion model.

Various shaped empty spaces or voids such as sphere-shaped voids, pipe-shaped voids, and plate-shaped voids are capable of being formed under the surface of a semiconductor substrate or wafer with a well-defined melting temperature. The shape of the empty spaces formed during the annealing conditions depends on the size, number and spacing of the cylindrical holes that are initially formed at a lower temperature.

Various predetermined arrangements of empty spaces or voids are capable of being formed under the surface of a semiconductor substrate or wafer with a well-defined melting temperature. For example, an appropriately-sized deep trench in a material with a well-defined melting temperature is transformed into empty spheres along the axis of the original trench at an annealing temperature within a predetermined a range below the melting temperature. The empty spheres are uniformly sized and spaced. Other predetermined arrangements are provided below.

FIGS. 4A-4F illustrate a process to form a sphere-shaped empty space in a gettering region, according to various embodiments of the present invention. A cylindrical hole 411 is formed through the surface 412 of a semiconductor volume where at least part of the volume forms a gettering region 402. As used here, the term hole refers to a void that extends from a surface of the volume into the solid material and that is defined by the solid material. The semiconductor volume 402 is heated (annealed) and undergoes the transformation illustrated in FIGS. 4B through 4F. One of ordinary skill in the art would understand, upon reading and comprehending this disclosure, that the desired annealing temperature is dependent on the well-defined melting temperature of the semiconductor material. The result of the surface transformation process is an empty sphere 413 formed below the surface 412 of the semiconductor volume 402.

In order to form a single sphere, which holds true for forming a single pipe (FIGS. 5A-5C) or plate (FIGS. 6A-6B), the length (L) and radius ($R_C$) of the cylindrical holes are chosen such that equation (1) with N=1 is satisfied. A vertical stacking of N empty spaces results if the length of the cylindrical holes is such that equation (1) is satisfied.

In order for single surface-transformed spheres to combine with other surface-transformed spheres, the center-to-center spacing ($D_{NT}$) between the initial cylindrical holes will satisfy the following equation:

$$2 \times R_C < D_{NT} < 3.76 \times R_C. \tag{4}$$

Satisfying this equation prevents the adjacent initial cylindrical holes from touching, yet allows the adjacent surface-transformed spheres to combine and form pipe and plate empty spaces, as shown in FIGS. 5A-5C and FIGS. 6A-6B and described below.

FIGS. 5A-5C illustrate a process to form a pipe-shaped empty space in a gettering region, according to various embodiments of the present invention. A linear array of cylindrical holes 511 is formed through a surface 512 of a semiconductor volume where at least part of the volume forms a gettering region 502. The cylindrical holes 511 have a center-to-center spacing ($D_{NT}$) as calculated using equation (4). The semiconductor material 502 is heated (annealed) and undergoes the transformation illustrated in FIGS. 5B through 5C. The result of the surface transformation process is an empty pipe-shaped void 514 formed below the surface 512 of the semiconductor volume 502. The radius ($R_P$) of the pipe-shaped void 514 is provided by the following equation:

$$R_P = \sqrt{\frac{8.86 \times R_C^3}{D_{NT}}}.  \quad (5)$$

FIGS. 6A-6B illustrate a process to form a plate-shaped empty space in a gettering region, according to various embodiments of the present invention. A two-dimensional array of cylindrical holes 611 is formed in a surface 612 of a semiconductor volume where at least part of the volume forms a gettering region 602. The cylindrical holes 611 have a center-to-center spacing ($D_{NT}$) as calculated using equation (4). The material 602 is heated (annealed) and undergoes the transformation illustrated in FIGS. 6B. The result of the surface transformation process is an empty plate-shaped void 615 formed below the surface 612 of the volume of material 602. The thickness ($T_P$) of a plate 320 is given by the following equation:

$$T_P = \frac{27.83 \times R_C^3}{D_{NT}^2}  \quad (6)$$

The voids are formed in a gettering region using surface transformation. In various embodiments, a precisely-determined arrangement of voids is formed using surface transformation to provide a large interior void surface to volume ratio and to provide a desired distribution of the voids throughout the gettering region. In various embodiments, the voids in the gettering region include nano-sized voids ("nano-voids"). In various embodiments, the present subject matter forms a precisely-determined arrangement of voids using surface transformation to provide a cellular material with a predictable mechanical failure for a given force. In various embodiments, the present subject matter forms a precisely-determined arrangement of voids using surface transformation to provide a cellular material with an anisotropic stiffness.

The size, shape and spacing of empty spaces is controlled by the diameter, depth and spacing of holes (or trenches) initially formed in a semiconductor material that has a defined melting temperature. Empty spaces or voids are formed after annealing the material in a temperature range below and near the defined melting temperature. The empty spaces or voids are capable of being formed with a spherical shape, a pipe shape, plate shape, various combinations of these shape types, and/or various dimensions for the various shape type and combinations of shape type. The volume of air incorporated in the surface transformed empty spaces is equal to the volume of air within the initial starting pattern of cylindrical holes. Thus, the surface transformed empty spaces do not cause additional stress in the material or a tendency for the material to crack.

The surface of the semiconductor volume will be smooth after the surface transformed empty spaces are formed if the initial cylinder length (L) is equal to an integer of a critical length ($\lambda_c$) such as $1 \times \lambda_c$ to form one sphere, $2 \times \lambda_c$ to form two spheres, $3 \times \lambda_c$ to form three spheres, etc. If the cylinder length (L) is not equal to an integer of a critical length ($\lambda_c$), then the surface will have dimples caused by air in the cylinder attributable to the length beyond an integer of a critical length ($\lambda_c$). That is, for a given length L and $\lambda_c$, the number of spheres formed is the integer of $L/\lambda_c$, and the remainder of $L/\lambda_c$ contributes to the dimples on the surface.

FIGS. 7A-7E illustrate the formation of empty spheres in a gettering region from initial cylindrical holes with the same radii and with varying length, according to various embodiments of the present invention. Initial cylindrical holes are represented using dashed lines 711. These initial cylindrical holes 711 have the same radius ($R_C$) and are drilled or otherwise formed to different depths as represented by FIGS. 7A, 7B, 7C, 7D and 7E. The resulting surface-transformed spheres 713 are illustrated with a solid line, as are the surface dimples 716 that form when the cylindrical hole depth is not an integer multiple of $\lambda_C$. These surface dimples can be removed using a simple polishing process to leave a smooth surface with uniform and closed spherical voids within the material. A crystalline semiconductor can be formed over the polished gettering region for use in fabricating semiconductor devices. The vertical position and number of the spherical voids is determined by the depth of the initial cylindrical holes.

In various embodiments of the present subject matter, the gettering region of the semiconductor substrate is formed by appropriately spacing the initially-formed holes such that, upon annealing the semiconductor material to provide the surface transformation process, the resulting voids are uniformly spaced (or approximately uniformly spaced) throughout the gettering region. The uniformly spaced voids provide the gettering region with the ability to getter a device region with more uniformity. Smaller voids provide more gettering uniformity. With more predictable gettering of device regions, the performance of the devices formed therein is more predictable, thus providing better yield.

In various embodiments, it is desirable to provide a gettering region with voids to provide a high internal void surface to volume ratio to improve gettering. The interior void surfaces have dangling bonds that are highly chemically reactive, and are useful to getter impurities.

Figure 8:
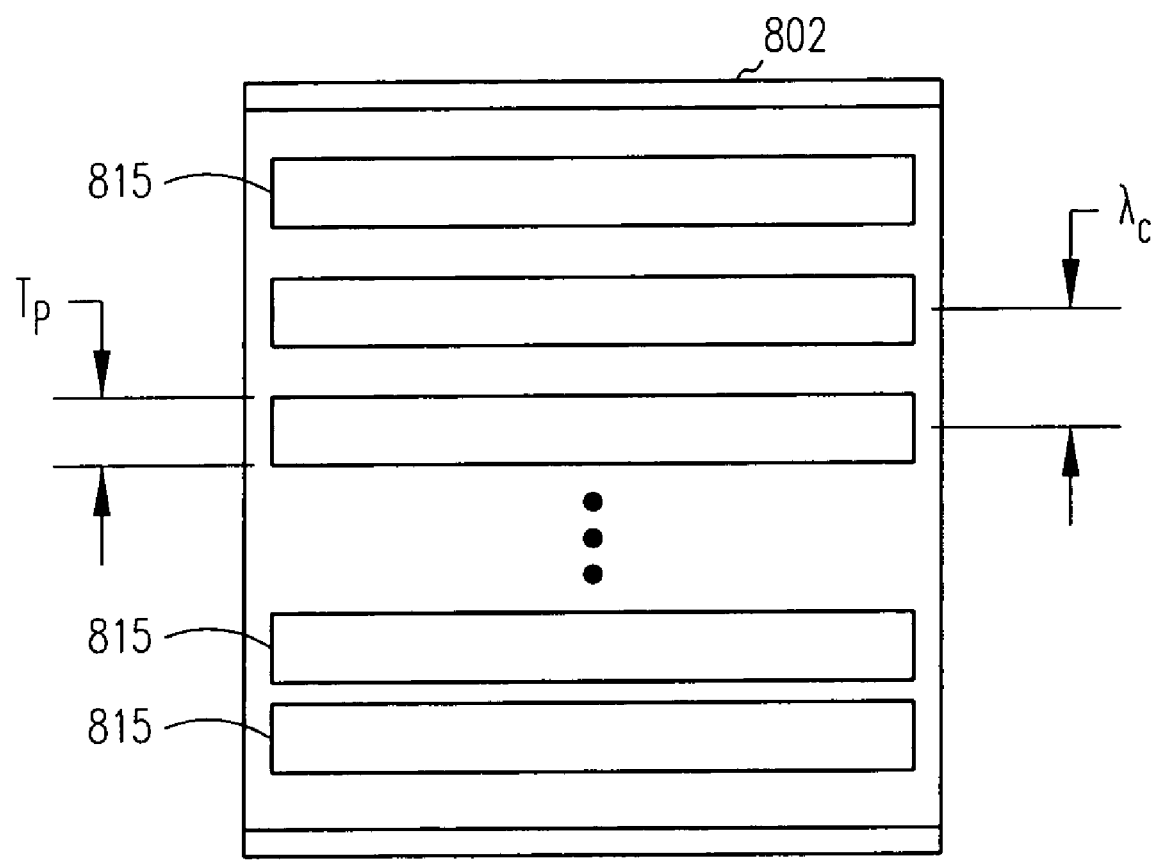
FIG. 8 illustrates a transformation formed stack of empty plates in a gettering region, according to various embodiments of the present invention.

FIG. 8 illustrates a transformation formed stack of empty plates 815 in a gettering region 802, according to various embodiments of the present invention. For example, the illustrated filling factor, f, is approximately equal to 0.78, which provides a relatively high porosity, a relatively low density, and a relatively high internal void surface to volume ratio. In the illustrated example, the surface transformation produces a vertical stack of empty plates in the materials. The number of empty plates formed depends on the length of the holes. Various embodiments of the vertical stack includes one ore more empty plates. From equation (6), it is determined that the thickness $T_P$ of the empty plate has a maximum value of $6.95 \times R_C$ when $D_{NT}$ is near the minimum allowed value of $2 \times R_C$ as inferred from equation (4). From equation (3), the center-to-center spacing ($\lambda$) of empty plates is $8.89 \times R_c$. It can be calculated that $f = 0.78$.

In various embodiments of the present subject matter, a plurality of space group symmetries of empty spheres of equal size are formed in a solid material.

FIG. 9 illustrates fourteen representative unit cells of space lattices which the voids in the gettering region can form, according to various embodiments of the present invention. For simplicity, only the cubic P unit cell of FIG. 9 with a lattice constant "$a_0$" is discussed below. One of ordinary skill in the art will understand, upon reading and comprehending this disclosure, how to form void patterns for the other unit cells illustrated in FIG. 9. Each void in the unit cell can be the same shape (e.g. sphere-shaped, plate-shaped or pipe-shaped voids). In various embodiments, the unit cell includes different combinations of sphere-shaped, plate-shaped, or pipe-shaped voids.

Figure 10:
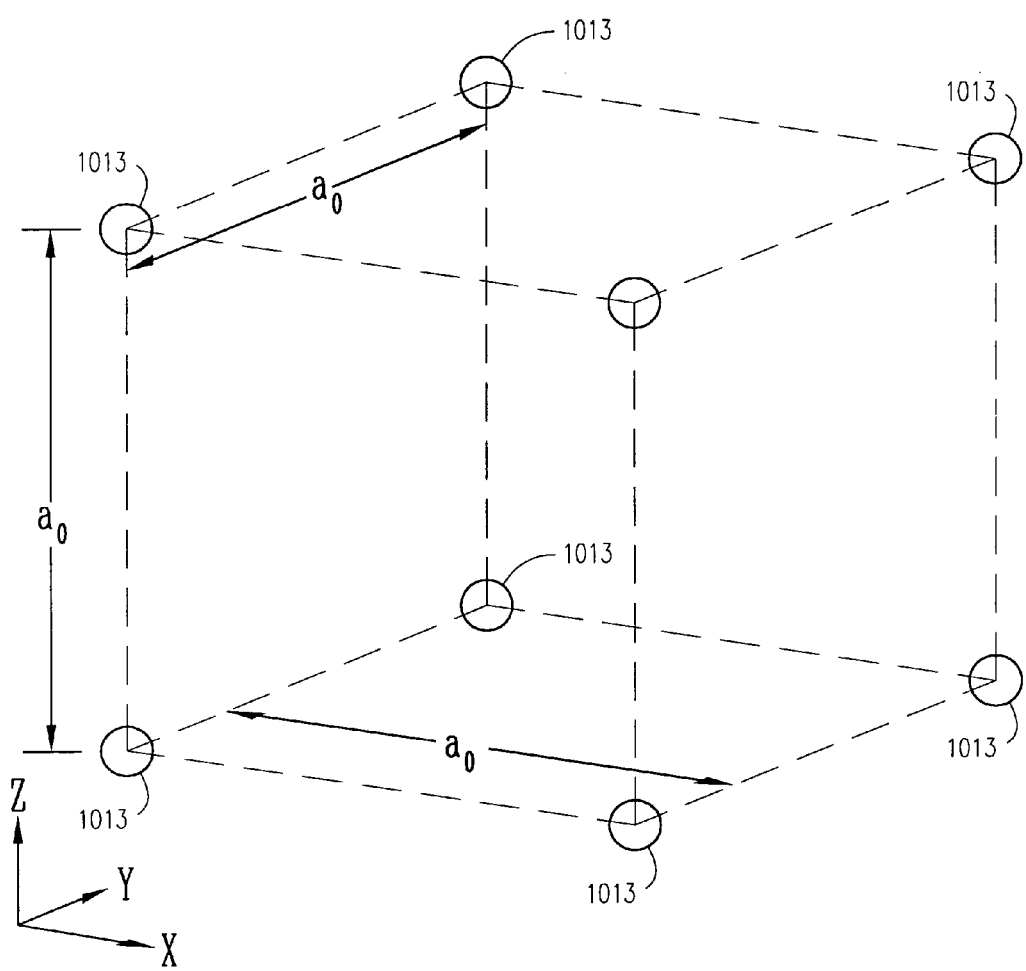
FIG. 10 illustrates a void pattern in a gettering region arranged to form the cubic P unit cell shown among the fourteen representative unit cells of FIG. 9.

FIG. 10 illustrates a void pattern in a gettering region arranged to form the cubic P unit cell shown among the fourteen representative unit cells of FIG. 9. A defined set of cylindrical holes are drilled or otherwise formed into the gettering region to form empty spheres 1013 of the same radius in the solid material at each of the illustrated unit cell lattice positions. For simplicity, the formation of one unit cell in the x-y plane and n unit cells in the z direction is discussed. Additional unit cells in the x-y planes are formed by repeatedly translating the hole pattern for the unit cell in the x and y directions. From equations (2) and (3), spheres are created with periodicity $a_0$ in the Z direction by drilling or otherwise forming the holes in the Z direction such that the radius of the holes ($R_C$) are represented by the following equation:

$$R_C = \frac{a_0}{8.89} \approx 0.11 \times a_0. \qquad (7)$$

After surface transformation, the radius, $R_S$ of each formed empty sphere is:

$$R_S = \frac{1.88}{8.89} \times a_0 \approx 0.212 \times a_0. \qquad (8)$$

In order to form n unit cells in the Z direction through surface transformation, the depth ($L_n$) of the initial cylinder in the Z direction is:

$$L_n = (n+1) \times a_0 = (n+1) \times 8.99 \times R_C. \qquad (9)$$

To form a single cubic P unit cell in the Z direction, n is set to 1 for the two deep arrangement of spheres such that the cylindrical holes are formed to the following hole depth:

$$L_1 = 2 \times 8.89 \times R_C = 2 \times a_0. \qquad (10)$$

Figure 11A:
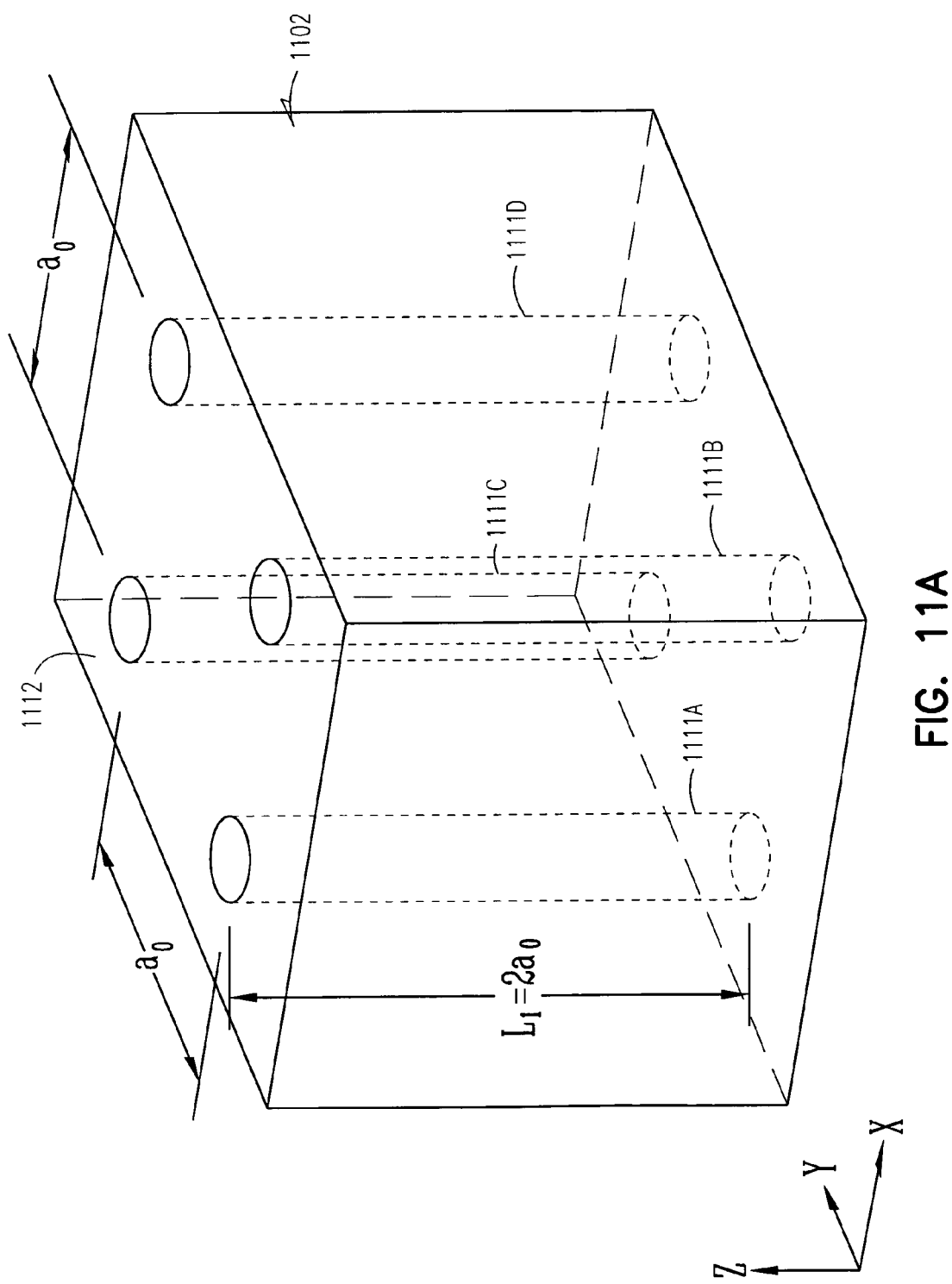
FIGS. 11A-11B illustrate a process for forming a cubic P lattice of spherical empty spaces, according to various embodiments of the present invention.
Figure 11B:
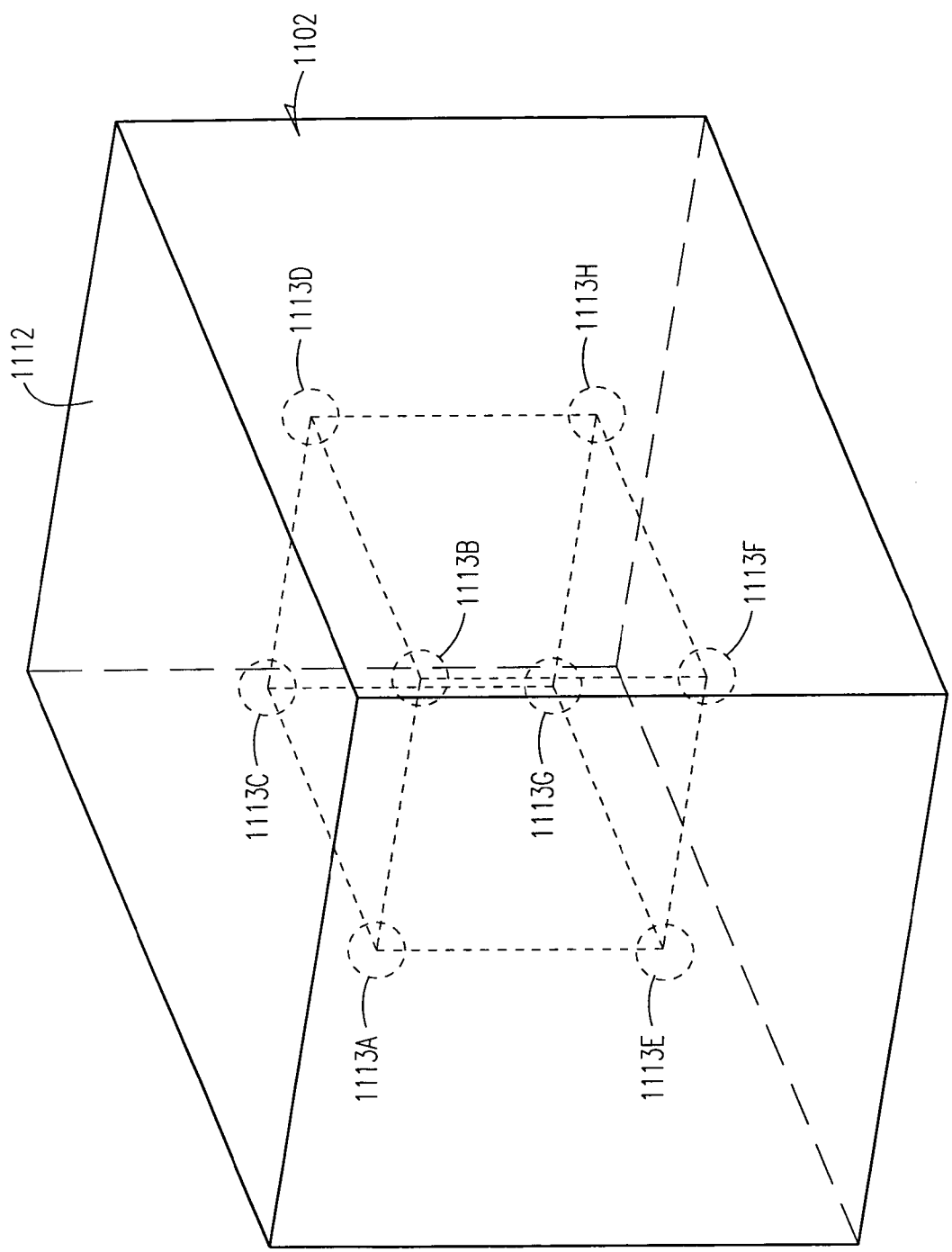

FIGS. 11A-11B illustrate a process for forming a cubic P lattice of spherical empty spaces, according to various embodiments of the present invention. Referring to FIG. 11A, four cylindrical holes 1111A, 1111B, 1111C and 1111D of radius Rc=$0.11 \times a_0$ are formed into the semiconductor volume 1102 from a surface 1112 to a depth $L=2 \times a_0$. The four cylindrical holes 1111A, 1111B, 1111C and 1111D are spaced apart along the x and y axes at a distance $a_0$. The solid material is annealed near its melting temperature to form sphere-shaped empty spaces 1113A, 1113B, 1113C, 1113D, 1113E, 1113F, 1113G and 1113H by surface transformation at desired sites of the cubic P unit cell as is shown in FIG. 11B.

One of ordinary skill in the art will understand, upon reading and comprehending this disclosure, that the unit cells of each primitive lattice in FIG. 6 can be formed to have equal sized empty spheres at each lattice site by forming in the Z direction an appropriate pattern of cylindrical holes of the same diameter in the x-y plane. The prescribed depths for these unit cells will generally be different.

In various embodiments, space lattices having more than one size of empty spheres in the unit cell are formed by forming initial cylindrical holes of more than one radius. In various embodiments, the holes are formed in more than one direction. The number of surface transformation annealing steps used to form the space lattice depends on the structure to be formed. A method to form a simple illustrative structural unit of empty spheres is described below. FIGS. 12A-12D illustrate a process for forming a simple unit of empty spheres having two radii in a gettering region, according to various embodiments of the present invention. The desired structure has four empty spheres of radius $R_S=0.212 \times a_0$, and four empty spheres of radius $R_S=\frac{1}{2} \times R_S=0.106 \times a_0$. All of the empty spheres have a closest center-to-center spacing of $a_0/2$. The process to form the above-described structure is illustrated in FIGS. 12A, 12B, 12C and 12D.

In FIG. 12A, two cylindrical holes 1211A of radius, $R_C=0.11 \times a_0$ and of length $L=2 \times a_0$ are formed in the Z direction. The solid material is annealed to effect surface transformation and form the four spheres 1213A with $R_S=0.212 \times a_0$, as shown in FIG. 12B.

In FIG. 12C, two cylindrical holes 1211B are drilled in the y-direction. These holes 1211B have a radius $R_C=0.055 a_0$, and a length $L'=a_0$. Again the material is annealed to effect surface transformation and the four smaller empty spheres 1213B to form the desired structure shown in FIG. 12D. The second annealing step only effects the cylindrical holes since they are not energetically stable. The four previously formed larger empty spheres are stable since they were formed during the first annealing.

Another method for forming the structure in FIG. 12D involves forming the cellular material in various deposition layers and forming the voids using a surface transformation process (i.e. hole formation and annealing) for each layer before a successive layer of material is deposited. Using this method, the structure illustrated in FIG. 12D is formed by a first deposition process, a first surface transformation process, a second deposition process, a second surface transformation process, a third deposition process, a third surface transformation process, a fourth deposition process, and a fourth surface transformation process. Each surface transformation step includes hole formation and annealing. For each layer, the hole formation pattern is calculated to achieve the desired spacing of resulting voids, both between and within layers, after the layer is annealed.

One of ordinary skill in the art will understand, upon reading and comprehending this disclosure, that a number of void arrangements are capable of being formed, a number of void sizes are capable of being formed, and that various combinations of void arrangements and void sizes are capable of being formed. One of ordinary skill in the art will understand, upon reading and comprehending this disclosure, that various different shapes of empty spaces can be formed, and that these various different shapes of empty spaces can be combined with other shapes of empty spaces. For example, a cellular material can include a number of sphere-shaped voids, a number of pipe-shaped voids, a number of plate-shaped voids, and various combinations of sphere-shaped void(s), pipe-shaped void(s), and plate-shaped void(s). One of ordinary skill in the art will understand, upon reading and comprehending this disclosure, that the various shapes can be stacked, and that various different shapes can be stacked together. For example, an arrangement of spheres can be stacked on top of an arrangement of plates. Additionally, each stack of voids can include various shapes. The precisely-determined arrangement of empty spaces is determined by the position, depth and diameter of the holes formed prior to the annealing process.

The figures presented and described above are useful to illustrate method aspects of the present subject matter. Some of these method aspects are described below. The methods described below are nonexclusive as other methods may be understood from the specification and the figures described above.

Figure 13:
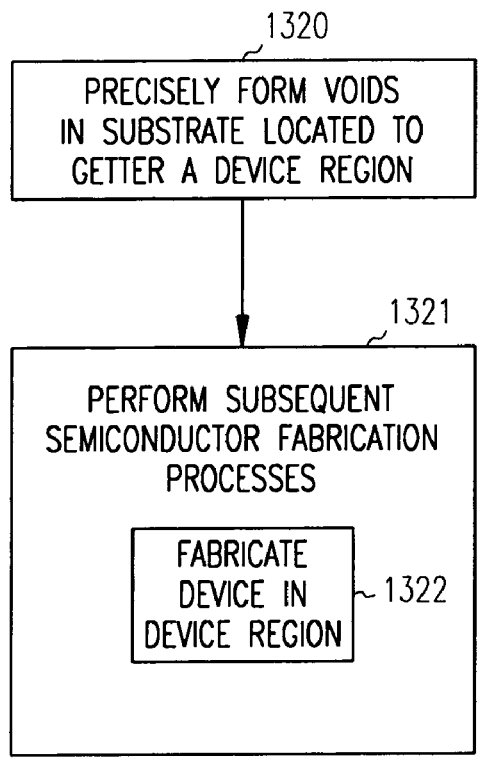
FIG. 13 illustrates a process for forming semiconductor devices, according to various embodiments of the present invention.

FIG. 13 illustrates a process for forming semiconductor devices, according to various embodiments of the present invention. At 1320, voids are precisely formed and are located to getter a device region. At 1321, subsequent semiconductor fabrication processes are performed, As represented at 1322, these subsequent semiconductor fabrication processes include forming a semiconductor device in a device region. An example of a semiconductor device is a transistor. In various embodiments, these semiconductor processes include depositing a semiconductor such as crystalline silicon on the gettering region, and forming a transistor using the crystalline silicon. In various embodiments, the voids are formed in a crystalline semiconductor volume, and the devices are formed using the crystalline semiconductor above the voids. In various embodiments, the voids are formed in a crystalline semiconductor volume, and the devices are formed using the crystalline semiconductor adjacent to the voids.

Figure 14:
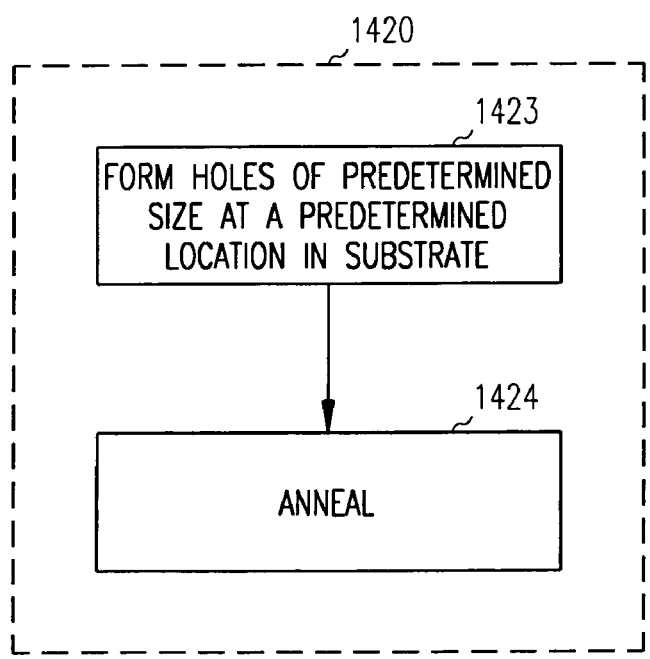
FIG. 14 illustrates a process for precisely forming voids in a substrate located to getter a device region as performed in the process for forming semiconductor devices of FIG. 13.

FIG. 14 illustrates a process for precisely forming voids in a substrate located to getter a device region as performed in the process for forming semiconductor devices of FIG. 13. The illustrated process 1420 generally corresponds to the 1320 in FIG. 13. In the illustrated embodiment, holes are formed to extend from a substrate surface and into a semiconductor substrate at 1423. The holes have a predetermined size and shape, and are formed in a predetermined location or pattern of locations in the substrate. In various embodiments, the holes have a generally cylindrical shape. At 1424, the substrate is annealed to form predetermined voids in the substrate. The substrate has a well-defined melting temperature, and the annealing temperature is slightly below the melting temperature. Depending on the size, shape and pattern of holes formed at 1423, the voids can include sphere-shape voids, a pipe-shape voids and/or plate-shaped voids.

The present subject matter provides the ability to form gettering regions with a precisely-determined arrangement of precisely-formed voids using surface transformation. In various embodiments, the precisely-determined arrangement of precisely-formed voids include uniformly spaced and closed voids that provide the gettering region with uniform gettering characteristics and with a large internal surface to volume ratio to provide a large number of uniformly distributed dangling bonds (defects in the crystalline structure) in proximity to a device region to effectively getter the device region. Thus, by effectively removing impurities from device regions, semiconductor devices are cable of being precisely fabricated.

System Level

Figure 15:
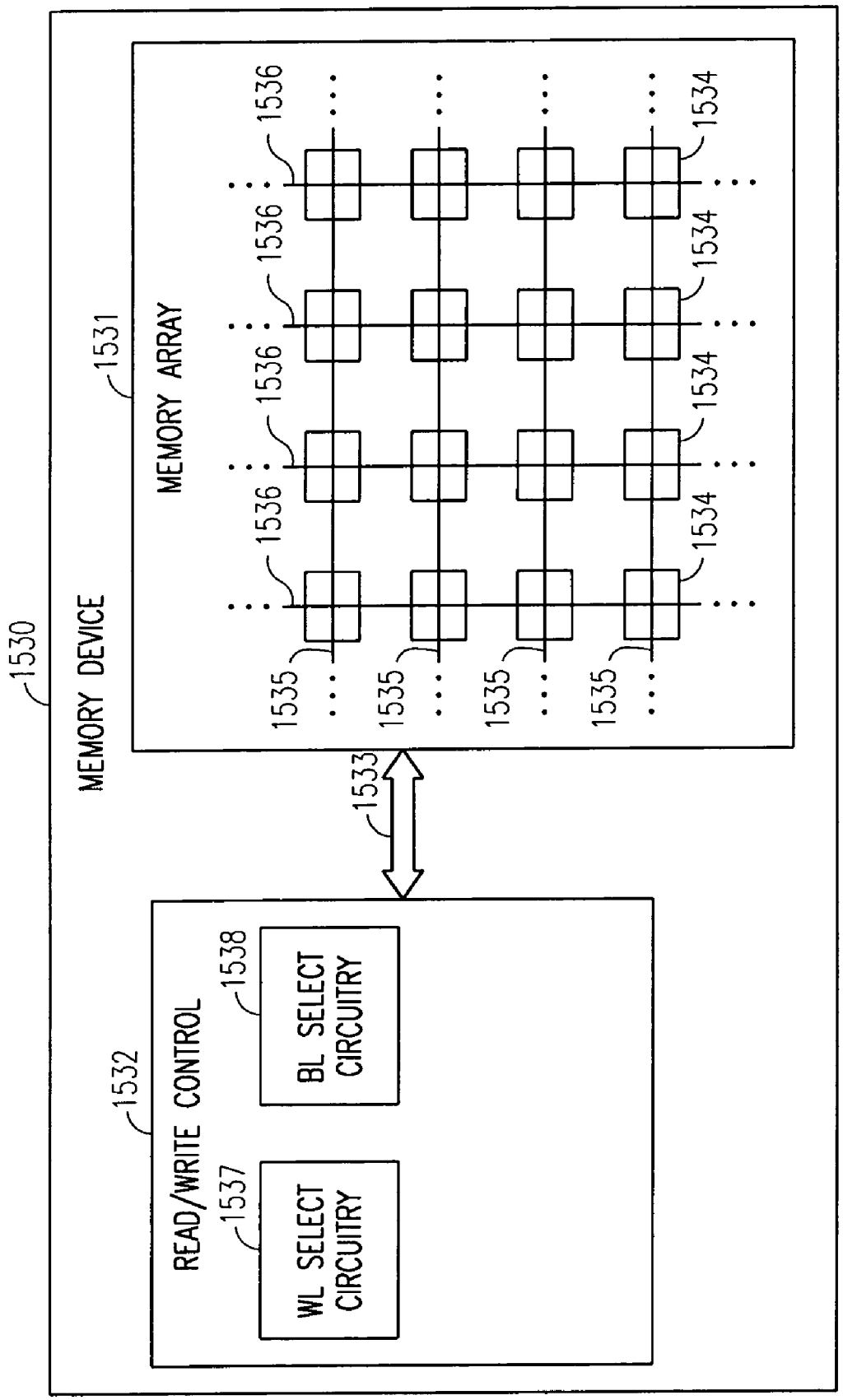
FIG. 15 is a simplified block diagram of a high-level organization of a memory device, according to various embodiments of the present invention.

FIG. 15 is a simplified block diagram of a high-level organization of a memory device, according to various embodiments of the present invention. The illustrated memory device 1530 includes a memory array 1531 and read/write control circuitry 1532 to perform operations on the memory array via communication line(s) 1533. The illustrated memory device 1530 may be a memory card or a memory module such as a single inline memory module (SIMM) and dual inline memory module (DIMM). One of ordinary skill in the art will understand, upon reading and comprehending this disclosure, that semiconductor components in the memory array 1531 and/or the control circuitry 1532 are able to be fabricated using the gettering regions having precise patterns of voids formed by surface transformation, as described above.

The memory array 1531 includes a number of memory cells 1534. The memory cells in the array are arranged in rows and columns. In various embodiments, word lines 1535 connect the memory cells in the rows, and bit lines 1536 connect the memory cells in the columns. The read/write control circuitry 1532 includes word line select circuitry 1537, which functions to select a desired row. The read/write control circuitry 1532 further includes bit line select circuitry 1538, which functions to select a desired column.

Figure 16:
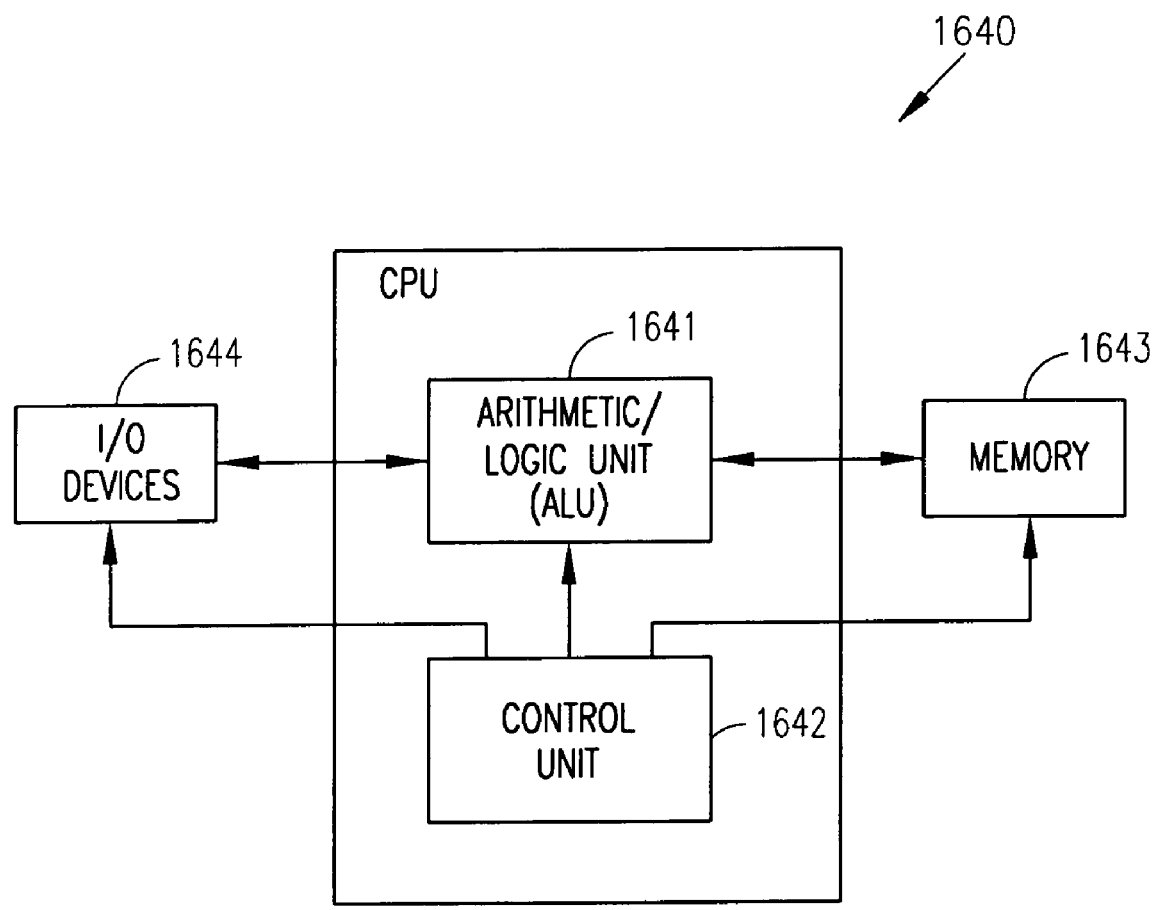
FIG. 16 is a simplified block diagram of a high-level organization of an electronic system, according to various embodiments of the present invention.

FIG. 16 is a simplified block diagram of a high-level organization of an electronic system, according to various embodiments of the present invention. In various embodiments, the system 1640 is a computer system, a process control system or other system that employs a processor and associated memory. The electronic system 1640 has functional elements, including a processor or arithmetic/logic unit (ALU) 1641, a control unit 1642, a memory device unit 1643 (such as illustrated at 1530 in FIG. 15) and an input/output (I/O) device 1644. Generally such an electronic system 1640 will have a native set of instructions that specify operations to be performed on data by the processor 1641 and other interactions between the processor 1641, the memory device unit 1643 and the I/O devices 1644. The control unit 1642 coordinates all operations of the processor 1641, the memory device 1643 and the I/O devices 1644 by continuously cycling through a set of operations that cause instructions to be fetched from the memory device 1643 and executed. According to various embodiments, the memory device 1643 includes, but is not limited to, random access memory (RAM) devices, read-only memory (ROM) devices, and peripheral devices such as a floppy disk drive and a compact disk CD-ROM drive. As one of ordinary skill in the art will understand, upon reading and comprehending this disclosure, any of the illustrated electrical components are capable of being fabricated to include the silicon germanium proximity gettering region in accordance with various embodiments of the present invention.

The illustration of the system 1640 is intended to provide a general understanding of one application for the structure and circuitry, and is not intended to serve as a complete description of all the elements and features of an electronic system using proximity gettering regions according to the various embodiments of the present invention. As one of ordinary skill in the art will understand, such an electronic system can be fabricated in single-package processing units, or even on a single semiconductor chip, in order to reduce the communication time between the processor and the memory device.

Applications containing a gettering region as described in this disclosure include electronic systems for use in memory modules, device drivers, power modules, communication modems, processor modules, and application-specific modules, and may include multilayer, multichip modules. Such circuitry can further be a subcomponent of a variety of electronic systems.

CONCLUSION

Various embodiments disclosed herein getter a semiconductor wafer by precisely forming voids, such as nanovoids, at desired locations in the wafers. Various embodiments form an even distribution of voids across the wafer below device regions. In various embodiments, precisely-formed gettering void patterns are formed proximate to selected regions where devices are fabricated on the semiconductor wafer. Various embodiments precisely form the void patterns below device regions. Numerous dangling bonds are present at the internal surfaces of the voids such that these internal surfaces are highly chemically reactive. Thus, various embodiments form the voids and void patterns to have the greatest surface to volume ratio to increase the gettering of impurities.

This disclosure includes several processes, circuit diagrams, and structures. The present invention is not limited to a particular process order or logical arrangement. Although specific embodiments have been illustrated and described herein, it will be appreciated by those of ordinary skill in the art that any arrangement which is calculated to achieve the same purpose may be substituted for the specific embodiments shown. This application is intended to cover adaptations or variations. It is to be understood that the above description is intended to be illustrative, and not restrictive. Combinations of the above embodiments, and other embodiments, will be apparent to those of skill in the art upon reviewing the above description. The scope of the present invention should be determined with reference to the appended claims, along with the full scope of equivalents to which such claims are entitled.

What is claimed is:

1. A method for forming a transistor, comprising:
    forming a proximity gettering region to be proximate to a crystalline semiconductor region in a wafer, the proximity gettering region including a precise arrangement of precisely-formed voids to getter impurities from the crystalline semiconductor region;
    forming a gate dielectric over the crystalline semiconductor region;
    forming a gate over the gate dielectric; and
    forming a first diffusion region and a second diffusion region in the crystalline semiconductor region, the first and second diffusion regions being separated by a channel region formed in the crystalline semiconductor region between the gate and the proximity gettering region.

2. The method of claim 1, wherein forming a proximity gettering region to be proximate to a crystalline semiconductor region in a wafer includes forming a plurality of holes into the wafer with a predetermined width and with a predetermined depth from a surface of the wafer, and wherein the predetermined width and the predetermined depth of the holes are factors in determining a size and a depth of the voids in the proximity gettering region.

3. The method of claim 1, wherein the precisely-formed voids include a sphere-shaped void.

4. The method of claim 1, wherein the precisely-formed voids include a pipe-shaped void.

5. The method of claim 1, wherein the precisely-formed voids include a plate-shaped void.

6. The method of claim 1, wherein the crystalline semiconductor region includes a crystalline silicon region.

7. A method for forming a semiconductor structure, comprising:
    forming a proximity gettering region to be proximate to a crystalline semiconductor region in a wafer, the proximity gettering region including a predetermined arrangement of precisely-formed voids to getter impurities from the crystalline semiconductor region; and
    performing semiconductor fabrication processes in the crystalline semiconductor region to form a semiconductor device proximate to the gettering region.

8. The method of claim 7, wherein the semiconductor structure includes a memory device, and performing semiconductor fabrication processes includes performing processes to form the memory device proximate to the gettering region, including:
    forming a memory array in the crystalline semiconductor region;
    forming a plurality of word lines for the memory array;
    forming a plurality of bit lines for the memory array; and
    forming control circuitry, including forming word line select circuitry and bit line select circuitry for use to select a number of memory cells for writing and reading operations.

9. The method of claim 7, wherein forming a proximity gettering region includes:
    forming a predetermined arrangement of a plurality of holes in a wafer through a surface of the wafer; and
    annealing the wafer to transform the arrangement of the plurality of holes into the predetermined arrangement of precisely-formed voids.

10. The method of claim 7, wherein the precisely-formed voids include a sphere-shaped void.

11. The method of claim 7, wherein the precisely-formed voids include a pipe-shaped void.

12. The method of claim 7, wherein the precisely-formed voids include a plate-shaped void.

13. A method for forming a transistor, comprising:
    forming a proximity gettering region to be proximate to a crystalline semiconductor region in a wafer, the proximity gettering region including a precise arrangement of sphere-shaped voids to getter impurities from the crystalline semiconductor region, wherein forming a proximity gettering region includes:
        forming a predetermined arrangement of a plurality of holes in the wafer through a surface of the wafer; and
        annealing the wafer to transform the predetermined arrangement of the plurality of holes into the arrangement of sphere-shaped voids to form the proximity gettering region in the wafer;
    forming a gate dielectric over the crystalline semiconductor region;
    forming a gate over the gate dielectric; and
    forming a first diffusion region and a second diffusion region in the crystalline semiconductor region, the first and second diffusion regions being separated by a channel region formed in the crystalline semiconductor region between the gate and the proximity gettering region.

14. The method of claim 13, wherein each void has an interior surface with dangling bonds.

15. The method of claim 13, wherein the wafer includes a bulk semiconductor wafer.

16. The method of claim 13, wherein the wafer includes a semiconductor-on-insulator (SOI) wafer.

17. A method for forming a transistor, comprising:
    forming a proximity gettering region to be proximate to a crystalline semiconductor region in a wafer, the proximity gettering region including a precise arrangement of pipe-shaped voids to getter impurities from the crystalline semiconductor region, wherein forming a proximity gettering region includes:
  forming a predetermined arrangement of a plurality of holes in the wafer through a surface of the wafer; and
  annealing the wafer to transform the predetermined arrangement of the plurality of holes into the arrangement of pipe-shaped voids to form the proximity gettering region in the wafer;
forming a gate dielectric over the crystalline semiconductor region;
forming a gate over the gate dielectric; and
forming a first diffusion region and a second diffusion region in the crystalline semiconductor region, the first and second diffusion regions being separated by a channel region formed in the crystalline semiconductor region between the gate and the proximity gettering region.

18. The method of claim 17, wherein each void has an interior surface with dangling bonds.

19. The method of claim 17, wherein the wafer includes a bulk semiconductor wafer.

20. The method of claim 17, wherein the wafer includes a semiconductor-on-insulator (SOI) wafer.

21. A method for forming a transistor, comprising:
forming a proximity gettering region to be proximate to a crystalline semiconductor region in a wafer, the proximity gettering region including a precise arrangement of plate-shaped voids to getter impurities from the crystalline semiconductor region, wherein forming a proximity gettering region includes:
  forming a predetermined arrangement of a plurality of holes in the wafer through a surface of the wafer; and
  annealing the wafer to transform the predetermined arrangement of the plurality of holes into the arrangement of plate-shaped voids to form the proximity gettering region in the wafer;
forming a gate dielectric over the crystalline semiconductor region;
forming a gate over the gate dielectric; and
forming a first diffusion region and a second diffusion region in the crystalline semiconductor region, the first and second diffusion regions being separated by a channel region formed in the crystalline semiconductor region between the gate and the proximity gettering region.

22. The method of claim 21, wherein each void has an interior surface with dangling bonds.

23. The method of claim 21, wherein the wafer includes a bulk semiconductor wafer.

24. The method of claim 21, wherein the wafer includes a semiconductor-on-insulator (SOI) wafer.

25. A method for forming a transistor, comprising:
forming a proximity gettering region to be proximate to a crystalline semiconductor region in a wafer, the proximity gettering region including a precise arrangement of voids to getter impurities from the crystalline semiconductor region, wherein forming a proximity gettering region includes:
  forming a predetermined arrangement of a plurality of holes in the wafer through a surface of the wafer, including forming each of the plurality of holes with a predetermined length and a predetermined diameter; and
  annealing the wafer to transform the predetermined arrangement of the plurality of holes with the predetermined length and the predetermined diameter into the arrangement of voids determined by the length and the diameter of the holes to form the proximity gettering region in the wafer;
forming a gate dielectric over the crystalline semiconductor region;
forming a gate over the gate dielectric; and
forming a first diffusion region and a second diffusion region in the crystalline semiconductor region, the first and second diffusion regions being separated by a channel region formed in the crystalline semiconductor region between the gate and the proximity gettering region.

26. The method of claim 25, wherein forming each of the plurality of holes includes forming each of the plurality of holes with a length that is approximately equal to an integer of a critical length ($\lambda_C$) dependent on a hole radius ($R_C$).

27. The method of claim 25, wherein forming each of the plurality of holes includes forming each of the plurality of holes with a length that is not approximately equal to an integer of a critical length ($\lambda_C$) dependent on a hole radius ($R_C$), the method further comprising polishing a top surface of the wafer after annealing in preparation to form the gate dielectric.

* * * * *